United States Patent
Kim

(10) Patent No.: US 12,411,614 B2
(45) Date of Patent: Sep. 9, 2025

(54) MEMORY DEVICE FOR SUPPRESSING HOT CARRIER INJECTION AND METHOD OF OPERATING THE SAME

(71) Applicant: SK hynix Inc., Icheon-si (KR)

(72) Inventor: Jong Wook Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 174 days.

(21) Appl. No.: 18/099,386

(22) Filed: Jan. 20, 2023

(65) Prior Publication Data
US 2024/0028220 A1    Jan. 25, 2024

(30) Foreign Application Priority Data

Jul. 20, 2022  (KR) .......................... 10-2022-0089582

(51) Int. Cl.
*G11C 16/26* (2006.01)
*G06F 3/06* (2006.01)
*G06F 13/16* (2006.01)

(52) U.S. Cl.
CPC .......... *G06F 3/0619* (2013.01); *G06F 3/0659* (2013.01); *G06F 3/0679* (2013.01); *G06F 13/1673* (2013.01); *G11C 16/26* (2013.01)

(58) Field of Classification Search
CPC .... G06F 3/0619; G06F 3/0659; G06F 3/0679; G11C 16/26; G11C 16/0483; G11C 16/32; G11C 16/34
See application file for complete search history.

(56) References Cited

U.S. PATENT DOCUMENTS

| | | | | |
|---|---|---|---|---|
| 2018/0130544 A1* | 5/2018 | Won | .................. | G11C 29/50004 |
| 2018/0374541 A1* | 12/2018 | Jung | .................. | G11C 16/0483 |
| 2019/0214093 A1* | 7/2019 | An | .......... | G06F 3/0604 |
| 2019/0221270 A1* | 7/2019 | An | .......... | G11C 16/26 |
| 2019/0318784 A1* | 10/2019 | Lee | .................. | G11C 16/0483 |
| 2021/0035622 A1* | 2/2021 | Kim | .................. | G11C 11/4074 |
| 2021/0158871 A1* | 5/2021 | Shin | .................. | G11C 16/0483 |
| 2022/0076727 A1* | 3/2022 | Han | .................. | G11C 16/3427 |

FOREIGN PATENT DOCUMENTS

KR   1020140107983 A   9/2014
KR   1020200008436 A   1/2020

* cited by examiner

*Primary Examiner* — Mushfique Siddique
(74) *Attorney, Agent, or Firm* — WILLIAM PARK AND ASSOCIATES LTD.

(57) ABSTRACT

The present technology includes a memory device and a method of operating the same. The memory device includes a memory block including pages configured of a plurality of memory cells, a peripheral circuit configured to perform a read operation on a selected page among the pages, and a control logic configured to control the peripheral circuit to perform a first read operation on a first logical page and then perform a second read operation on a second logical page, among the first and second logical pages in the selected page, during the read operation. The control logic is configured to control the peripheral circuit to adjust a channel initialization time according to the first logical page after the first read operation is ended, and perform a channel initialization operation during the channel initialization time during the second read operation.

12 Claims, 22 Drawing Sheets

FIG. 11

[CIT_T]

| Previous LPG | Channel Initializing Time (CIT) |
|---|---|
| MSB | 3CIT |
| CSB | 2CIT |
| LSB | 1CIT |

(1CIT<2CIT<3CIT)

FIG. 14

[CIT_T]

| Previous LPG | Channel Initializing Time (CIT) |
|---|---|
| LSB | 4CIT |
| CSB | 3CIT |
| MSB | 2CIT |
| QSB | 1CIT |

(1CIT<2CIT<3CIT<4CIT)

MEMORY DEVICE FOR SUPPRESSING HOT CARRIER INJECTION AND METHOD OF OPERATING THE SAME

CROSS-REFERENCE TO RELATED APPLICATION

The present application claims priority under 35 U.S.C. § 119(a) to Korean patent application number 10-2022-0089582, filed on Jul. 20, 2022, in the Korean Intellectual Property Office, the entire disclosure of which is incorporated herein by reference.

BACKGROUND

1. Technical Field

The present disclosure relates to a memory device and a method of operating the same, and more particularly, to a memory device having a three-dimensional structure and a method of operating the same.

2. Related Art

A memory device may include a memory cell array in which data are stored, a peripheral circuit configured to perform a program, read, or erase operation, and a control logic configured to control the peripheral circuit.

The memory cell array may include a plurality of memory blocks, and each of the plurality of memory blocks may include a plurality of memory cells. A memory device having a three-dimensional structure may include memory cells that are stacked on a substrate. Therefore, a string including the memory cells may be formed in a vertical direction from the substrate.

As an integration degree of the memory device increases, the number of strings that are included in the memory block increases. Therefore, as the distance between the strings decreases, an electrical defect may occur in the strings. Furthermore, channel boosting in unselected strings can cause hot carrier injection due to a voltage difference between the selected word line and unselected strings. This results in electrons being injected into unselected memory cells. Hot carrier injection can reduce memory reliability, which needs to be prevented.

SUMMARY

According to an embodiment of the present disclosure, a memory device includes a memory block including pages configured of a plurality of memory cells, a peripheral circuit configured to perform a read operation on a selected page, among the pages, and a control logic configured to control the peripheral circuit to perform a first read operation on a first logical page and then perform a second read operation on a second logical page, among the first and second logical pages in the selected page, during the read operation. The control logic is configured to control the peripheral circuit to adjust a channel initialization time according to the first logical page after the first read operation is ended and perform a channel initialization operation during the channel initialization time during the second read operation.

According to an embodiment of the present disclosure, a method of operating a memory device includes performing a first read operation on a first logical page in a selected page, adjusting a channel initialization time according to the first logical page when the first read operation is ended, performing a channel initialization operation on memory cells that are included in the selected page during the channel initialization time, and performing a second read operation on a second logical page that is stored in the selected page when the channel initialization operation is ended.

According to an embodiment of the present disclosure, a memory device includes a memory block including pages configured of a plurality of memory cells, a peripheral circuit configured to perform a read operation on a selected page, among the pages, and a control logic configured to control the peripheral circuit to perform a first read operation on a first logical page and then perform a second read operation on a second logical page, among first and second logical pages, during the read operation. The control logic is configured to control the peripheral circuit to adjust a channel initialization time according to an accumulated boosting level of the selected page and perform a channel initialization operation during the channel initialization time during the first read operation.

According to an embodiment of the present disclosure, a method of operating a memory device includes setting a boosting reference value of a selected page, checking an accumulated number of read operations of the selected page, setting a channel initialization time that is longer than a default time when the accumulated number of read operations is equal to or greater than the boosting reference value, performing a channel initialization operation on strings that include the selected page during the channel initialization time, and reading data in the selected page in a logical page unit.

BRIEF DESCRIPTION OF THE DRAWINGS

FIG. 11 is a diagram illustrating a channel initialization time set according to a logical page in the read operation of the TLC method.

FIG. 14 is a diagram illustrating the channel initialization time set according to the logical page in the read operation of the QLC method.

DETAILED DESCRIPTION

Specific structural or functional descriptions disclosed below are exemplified to describe an embodiment according to the concept of the present disclosure. The embodiment according to the concept of the present disclosure is not construed as being limited to the embodiments described below and may be variously modified and replaced with other equivalent embodiments.

Hereinafter, terms such as first and second may be used to describe various components, but the components are not limited by the terms. The terms are used for the purpose of distinguishing one component from another component.

An embodiment of the present disclosure provides a memory device and a method of operating the same for suppressing hot carrier injection that may occur in unselected strings during a read operation of a selected string.

The present technology may improve reliability of a read operation performed in a memory device.

Figure 1:
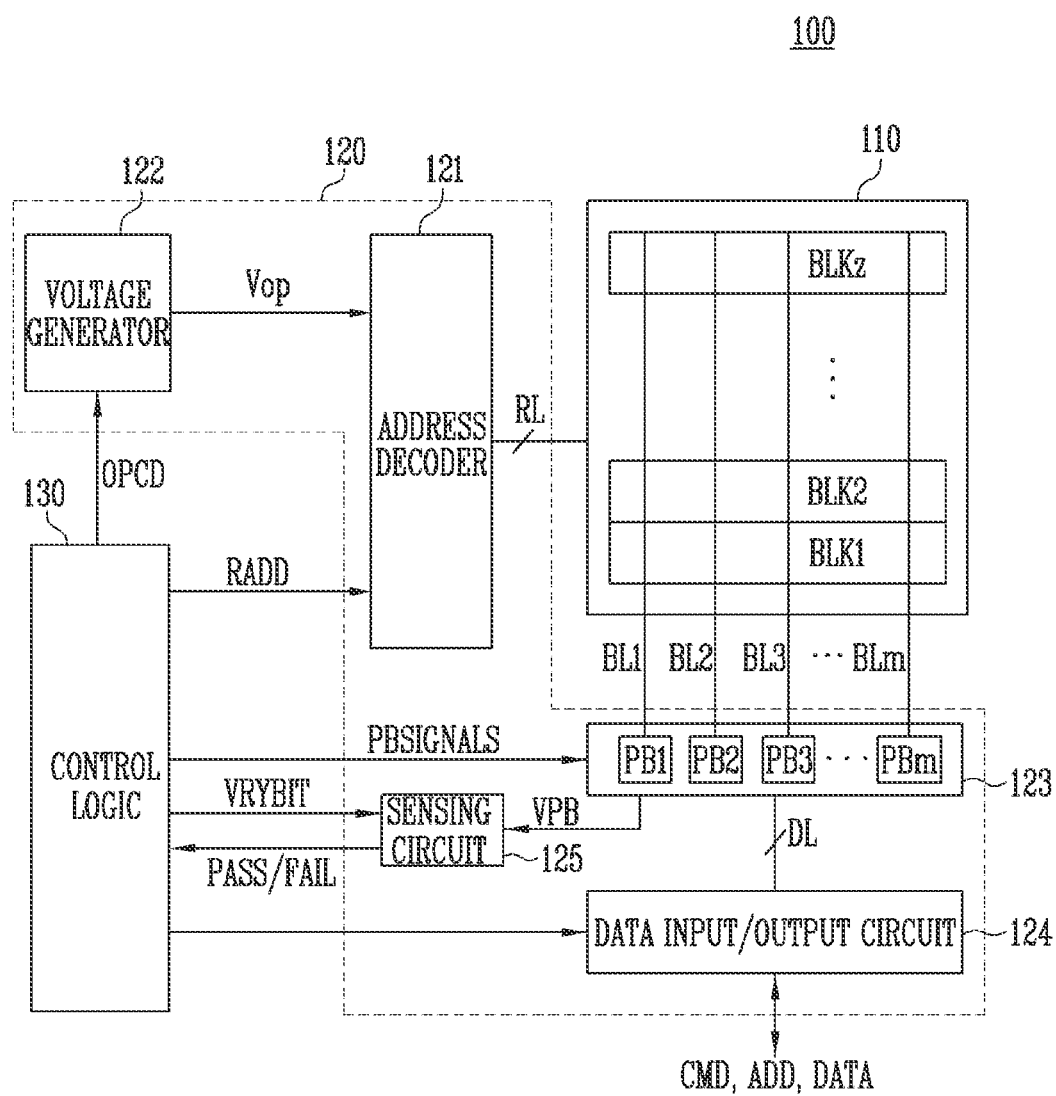
FIG. 1 is a diagram illustrating a memory device.

FIG. 1 is a diagram illustrating a memory device.

Referring to FIG. 1, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be connected to an address decoder 121 through row lines RL. The row lines RL may include drain select lines, word lines, source select lines, and a source line. The plurality of memory blocks BLK1 to BLKz may be connected to a page buffer group 123 through bit lines BL1 to BLm. Each of the plurality of memory blocks BLK1 to BLKz may include a plurality of memory cells. The plurality of memory cells may be nonvolatile memory cells. Among the plurality of memory cells, memory cells that are connected to the same word line may be defined as a page. Therefore, each of the plurality of memory blocks BLK1 to BLKz may include a plurality of pages.

The peripheral circuit 120 may drive the memory cell array 110. For example, the peripheral circuit 120 may drive the memory cell array 110 to perform a program operation, a read operation, and an erase operation under control of the control logic 130. As another example, the peripheral circuit 120 may apply various operation voltages Vop to the row lines RL and the bit lines BL1 to BLm according to the control of the control logic 130 or may discharge the applied voltages.

The peripheral circuit 120 may include the address decoder 121, a voltage generator 122, the page buffer group 123, a data input/output circuit 124, and a sensing circuit 125.

The address decoder 121 may be connected to the memory cell array 110 through the row lines RL. The row lines RL may include the drain select lines, the word lines, the source select lines, and the source line.

The address decoder 121 may be configured to operate in response to the control of the control logic 130. The address decoder 121 may receive a row address RADD from the control logic 130 and may select a memory block corresponding to the row address RADD. For example, the address decoder 121 may decode a block address, among the received row addresses RADD, and may select at least one memory block, among the memory blocks BLK1 to BLKz, according to the decoded block address. The address decoder 121 may transmit the operation voltages Vop that are provided from the voltage generator 122 to the row lines RL that are connected to the selected memory block.

The voltage generator 122 may be configured to generate the operation voltages Vop having various levels by using an internal power voltage that is supplied to the memory device 100. The voltage generator 122 may generate and output the operation voltages Vop that are used in the program, read, or erase operation, in response to an operation code OPCD output from the control logic 130. For example, the voltage generator 122 may adjust a level and a supply time of the operation voltages Vop in response to the operation code OPCD. For example, the voltage generator 122 may generate a program voltage, a pass voltage, a verify voltage, a read voltage, an erase voltage, a turn on voltage, a turn off voltage, a source line voltage, and the like as the operation voltages Vop and may supply the operation voltages Vop to the address decoder 121. For example, during the read operation, the voltage generator 122 may generate the read voltage, the pass voltage, the turn on voltage, the turn off voltage, and a ground voltage as the operation voltages Vop in response to the operation code OPCD and may supply the generated operation voltages Vop to the address decoder 121. The read voltage may be a voltage that is supplied to a selected word line, and the pass voltage may be a voltage that is supplied to unselected word lines. The turn on voltage and the turn off voltage may be voltages that are applied to the drain select line or the source select line. The ground voltage may be a voltage that is applied to the source line and may be a 0V voltage. The voltage generator 122 may adjust the supply time of each of the operation voltages Vop according to the operation code OPCD. For example, the voltage generator 122 may adjust output times of each of the read voltage, the pass voltage, the turn on voltage, the turn off voltage, and the ground voltage according to the operation code OPCD and may respectively output the voltages according to the adjusted time.

The page buffer group 123 may include first to m-th page buffers PB1 to PBm. The respective first to m-th page buffers PB1 to PBm may be connected to the memory cell array 110 through the first to m-th bit lines BL1 to BLm. The first to m-th page buffers PB1 to PBm may operate in response to page buffer control signals PBSIGNALS that are output from the control logic 130. The first to m-th page buffers PB1 to PBm may transmit data DATA to the data input/output circuit 124 through data lines DL.

During the program operation, the first to m-th page buffers PB1 to PBm may store the data DATA that are received from an external device through the data input/output circuit 124 and may transmit a program allowable voltage or a program inhibit voltage to the bit lines BL1 to BLm according to the stored data DATA. For example, the program allowable voltage may be 0V, and the program inhibit voltage may be a power voltage.

During the read operation, the first to m-th page buffers PB1 to PBm may sense the data DATA through a voltage or a current of the bit lines BL1 to BLm that are determined according to a threshold voltage of memory cells of a selected page and may transmit the sensed data DATA to the data input/output circuit 124 through the data lines DL.

During the erase operation, the first to m-th page buffers PB1 to PBm may float the bit lines BL1 to BLm or apply a 0V voltage to the bit lines BL1 to BLm.

The data input/output circuit 124 may be connected to the first to m-th page buffers PB1 to PBm through the data lines DL. The data input/output circuit 124 may operate in response to the control of the control logic 130.

The data input/output circuit 124 may be configured to communicate between an external controller and the memory device 100. For example, during the program operation, the data input/output circuit 124 may transmit the data DATA that are received from the external controller to the page buffer group 123 through the data lines DL. During the read operation, the data input/output circuit 124 may output the data DATA that are transmitted from the page buffer group 123 to the external controller.

During the read operation or a verify operation, the sensing circuit 125 may generate a reference current in response to an allowable bit VRYBIT signal that is generated by the control logic 130 and may compare a sensing voltage VPB that is received from the page buffer group 123 with a reference voltage that is generated by the reference current to output a pass signal PASS or a fail signal FAIL to the control logic 130. For example, the sensing circuit 125 may output the pass signal PASS to the control logic 130 when a level of the sensing voltage VPB is greater than or equal to the reference voltage. The sensing circuit 125 may output the fail signal FAIL to the control logic 130 when the level of the sensing voltage VPB is lower than the reference voltage.

The control logic 130 may be configured to control the address decoder 121, the voltage generator 122, the page buffer group 123, the data input/output circuit 124, and the sensing circuit 125 according to a command CMD and an address ADD. The control logic 130 may include software and hardware configured to control an overall operation of the memory device 100. For example, the control logic 130 may generate the operation code OPCD, the row address RADD, the page buffer control signals PBSIGNALS, and the allowable bit VRYBIT in response to the command CMD and the address ADD. The control logic 130 may output the operation code OPCD to the voltage generator 122, output the row address RADD to the address decoder 121, output the page buffer control signals PBSIGNALS to the page buffer group 123, and output the allowable bit VRYBIT to the sensing circuit 125. The control logic 130 may determine whether the verify operation passes or fails in response to the pass signal PASS or the fail signal FAIL that is output from the sensing circuit 125.

During the read operation, the control logic 130 may control the read operation that is performed on the selected memory block. For example, the control logic 130 may control read operations of logical pages that are performed on the selected page. During the read operation, the control logic 130 may control a channel initialization operation according to a previous logical page. For example, the control logic 130 may be configured to adjust a channel initialization time during a read operation of a subsequent logical page according to a logical page of a read operation that is performed in a previous step. The channel initialization operation may be an operation of initializing channels of unselected strings, and the channel initialization time may be a time in which the channel initialization operation is performed. For example, the channel initialization time may be a time between a start time and an end time of the channel initialization operation.

The control logic 130 may be configured to count the number of read operations of logical pages that are performed in the selected memory block or the selected page. The control logic 130 may be configured to compare an accumulated number of read operations with a boosting reference value and adjust the channel initialization time according to a comparison result. The control logic 130 may change the operation code OPCD so that the channel initialization time is adjusted. In addition, the control logic 130 may change the operation code OPCD so that the channel initialization operation is omitted.

Figure 2:
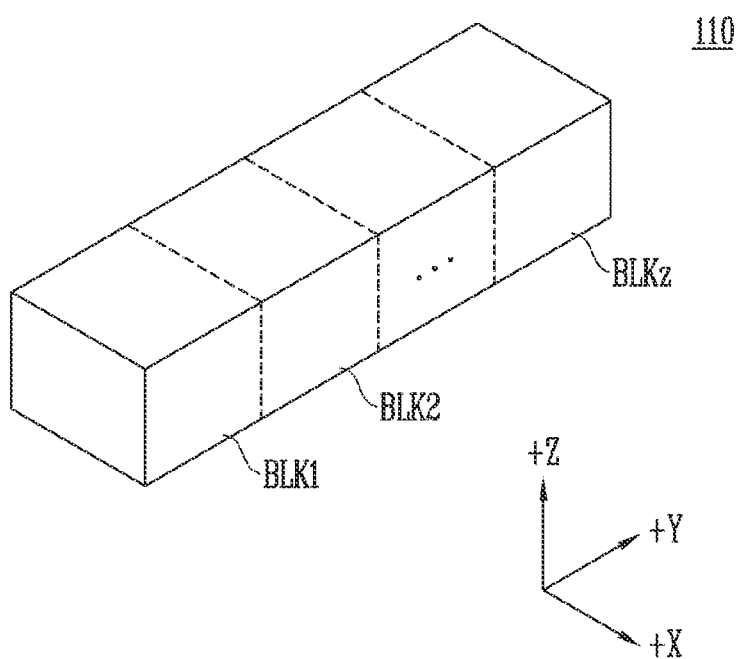
FIG. 2 is a diagram illustrating a memory cell array.

FIG. 2 is a diagram illustrating the memory cell array.

Referring to FIG. 2, the memory cell array 110 may include the plurality of memory blocks BLK1 to BLKz. Each of the plurality of memory blocks BLK1 to BLKz may be configured in a three-dimensional structure. For example, the plurality of memory blocks BLK1 to BLKz may include a plurality of memory cells that are stacked on a substrate. Therefore, the plurality of memory cells may be arranged along a +X direction, a +Y direction, and a +Z direction.

Figure 3:
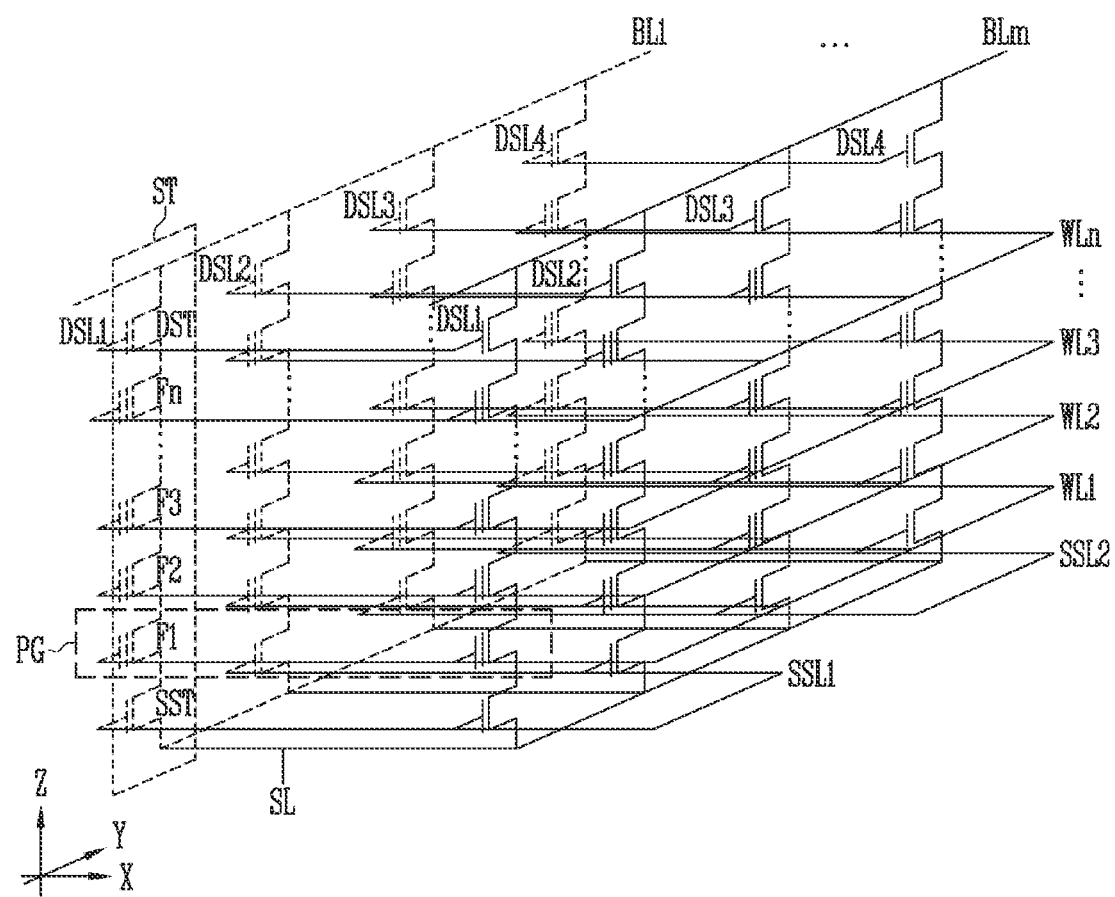
FIG. 3 is a circuit diagram illustrating any one memory block among memory blocks shown in FIG. 2.
Figure 4:
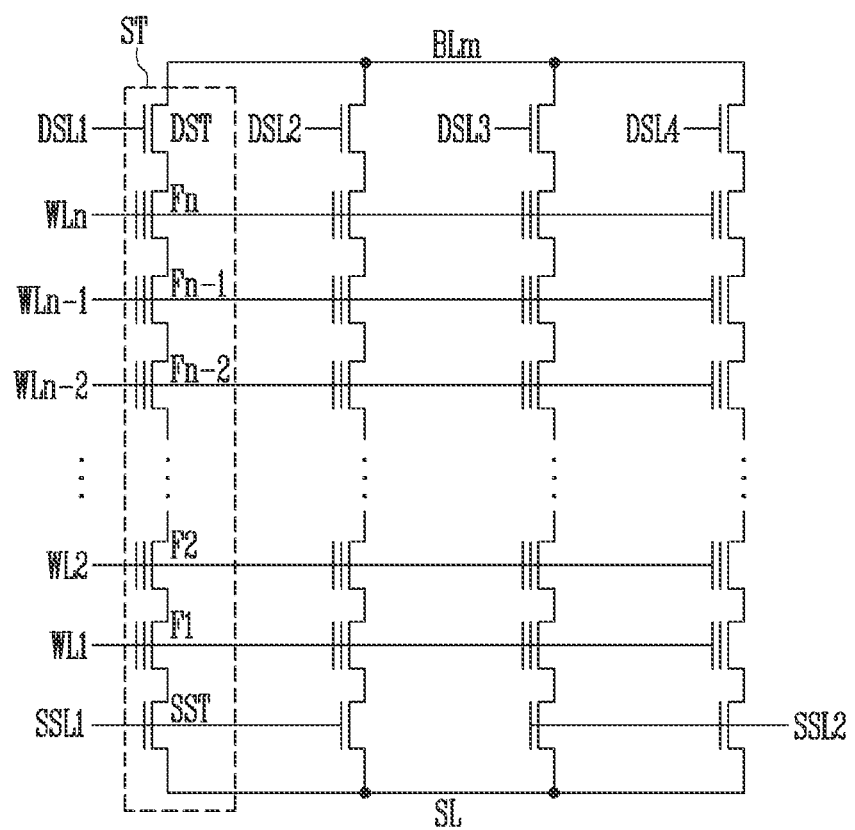
FIG. 4 is a circuit diagram illustrating strings shown in FIG. 3.

FIG. 3 is a circuit diagram illustrating any one memory block, among the memory blocks, shown in FIG. 2, and FIG. 4 is a circuit diagram illustrating strings, shown in FIG. 3.

Referring to FIGS. 3 and 4, the strings ST may be connected between the first to m-th bit lines BL1 to BLm and a source line SL. The strings ST may include source select transistors SST, memory cells F1 to Fn (n is a positive integer), and drain select transistors DST that are connected in series between the source line SL and the first to m-th bit lines BL1 to BLm.

Gates of the source select transistors SST, included in different strings ST, may be connected to a first or second source select line SSL1 or SSL2. Among the source select transistors SST, source select transistors that are adjacent in the X direction may be connected to the same source select line. Some of the source select transistors SST that are adjacent in the Y direction may be connected to different source select lines. For example, first and second source select transistors, among the source select transistors SST that are arranged along the Y direction, may be connected to the first source select line SSL1, and third and fourth source select transistors, among the source select transistors SST, may be connected to the second source select line SSL2.

Gates of the memory cells F1 to Fn, included in different strings ST, may be connected to the word lines WL1 to WLn.

Gates of the drain select transistors DST, included in different strings ST, may be connected to any one of the first to fourth drain select lines DSL1 to DSL4. Gates of drain select transistors, arranged in the X direction, among the drain select transistors DST, may be commonly connected to the same drain select line, but drain select transistors that are arranged in the Y direction may be connected to different drain select lines. For example, when the drain select transistors DST are sequentially arranged along the Y direction, first drain select transistors may be connected to a first drain select line DSL1, second drain select transistors may be connected to a second drain select line DSL2, third drain select transistors may be connected to a third drain select line DSL3, and fourth drain select transistors may be connected to a fourth drain select line DSL4.

During the program or read operation, strings ST that are connected to a selected drain select line in the selected memory block may be selected strings, and strings ST that are connected to unselected drain select lines may be unselected strings. For example, a positive turn on voltage may be applied to the first drain select line DSL1, a turn off voltage of 0V may be applied to the second to fourth drain select lines DSL2 to DSL4, the first drain select line DSL1 may become a selected drain select line, and the second to fourth drain select lines DSL2 to DSL4 may become unselected drain select lines. Therefore, the strings ST that are connected to the first drain select line DSL1 may become the selected strings, and the strings ST that are connected to the second to fourth drain select lines DSL2 to DSL4 may become the unselected strings.

During the program or read operation, the first source select line SSL1 that is connected to the selected strings, among the first and second source select lines SSL1 and SSL2, may become a selected source select line, and the second source select line SSL2 that is connected to the unselected strings may become unselected source select line. Therefore, the selected strings and a portion of the unselected string may be connected to the selected source select line, and only the unselected strings may be connected to the unselected source select line.

Memory cells that are connected to the same word line may configure one page (PG). Here, the page means a physical page. For example, memory cells that are arranged along the X direction, among first memory cells F1 that are connected to a first word line WL1, may configure one page PG. Therefore, a plurality of pages may be connected to each of first to n-th word lines WL1 to WLn.

Since the program or read operation is performed on the selected page, the selected page, among the pages that are connected to the same word line, may be determined by the selected drain select line. For example, during the read operation, when the first word line WL1 is a selected word line and the first drain select line DSL1 is the selected drain select line, among the memory cells that are connected to the first word line WL1, selected memory cells that are included in the strings that are connected to the first drain select line DSL1 may configure the selected page, and the remaining unselected memory cells may configure unselected pages.

The memory cells may be programmed in various methods, and the read operation may also vary according to a program method. For example, the program or read operation may be classified into a single level cell method or a multi-level cell method according to the number of bits of data stored in one memory cell. The single level cell method may be a method in which one bit of data is stored in one memory cell, and the multi-level cell method may be a method in which two or more bits of data are stored in one memory cell. The multi-level cell method may be classified into a triple level cell method or a quad level cell method according to the number of bits of data stored in one memory cell. The triple level cell method may be a method in which three bits of data are stored in one memory cell, and the quad level cell method may be a method in which four bits of data are stored in one memory cell. Therefore, based on the triple level cell and quad level cell methods, the multi-level cell method may be defined as a method in which two bits of data are stored in one memory cell. In addition, the program operation may be performed in various methods in which five or more bits of data are stored in one memory cell.

The read operation may be performed based on a method corresponding to the program method. For example, when the memory cells are programmed in the triple level cell method, the read operation may also be performed in the triple level cell method. As another embodiment, when the memory cells are programmed in the quad level cell method, the read operation may also be performed in the quad level cell method.

In the figure, one source select transistor SST and one drain select transistor DST may be included in one string ST, but a plurality of source select transistors SST and a plurality of drain select transistors DST may be included in one string ST according to the memory device. In addition, dummy cells may be included between the source select transistor SST, the memory cells F1 to Fn, and the drain select transistor DST according to the memory device. Since the dummy cells are cells that are added to improve an electrical characteristic of the strings ST, the dummy cells may store dummy data without storing user data differently from the memory cells F1 to Fn.

Figure 5:
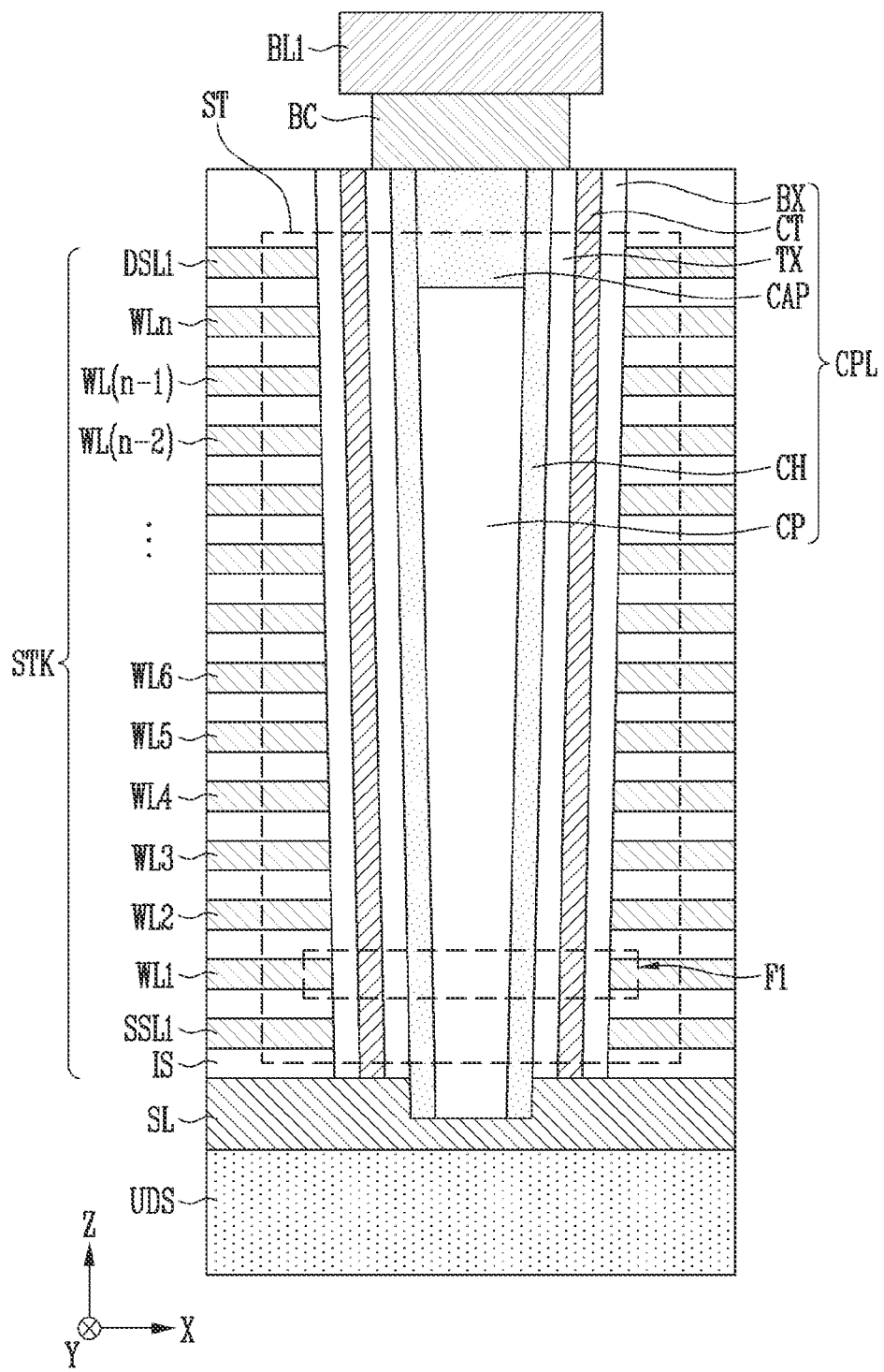
FIG. 5 is a cross-sectional view illustrating a structure of any one of the strings shown in FIG. 3.
Figure 6:
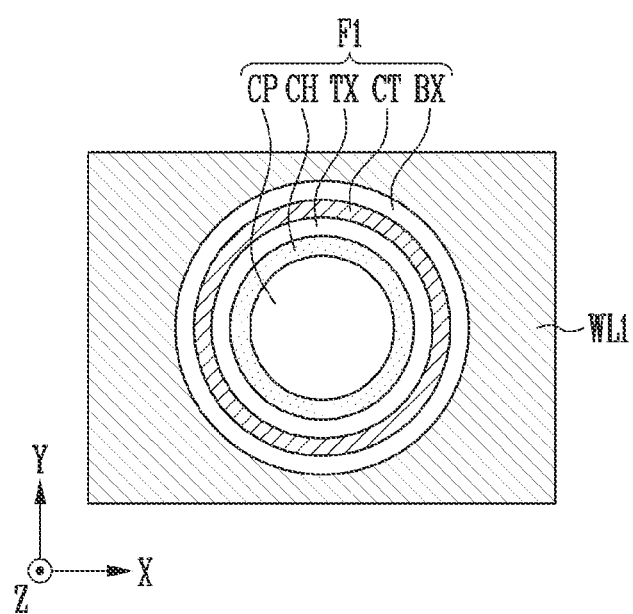
FIG. 6 is a layout illustrating a structure of any one of memory cells shown in FIG. 5.

FIG. 5 is a cross-sectional view illustrating a structure of any one of the strings shown in FIG. 3, and FIG. 6 is a layout illustrating a structure of any one of the memory cells shown in FIG. 5.

Referring to FIGS. 5 and 6, a string ST that is connected between the first bit line BL1 and the source line SL, among the strings ST, shown in FIG. 3, is shown as an example.

The source line SL may be formed on a lower structure UDS, and a stack structure STK may be formed on the source line SL. The lower structure UDS may be a substrate or a peripheral circuit. The source line SL may be formed of a conductive material. For example, the source line SL may be formed of doped polysilicon. The stack structure STK may include gate lines and insulating layers IS. The gate lines may include the first source select line SSL1, the first to n-th word lines WL1 to WLn, and the first drain select line DSL1. The first source select line SSL1, the first to n-th word lines WL1 to WLn, and the first drain select line DSL1 may be formed of a conductive material. For example, the first source select line SSL1, the first to n-th word lines WL1 to WLn, and the first drain select line DSL1 may be formed of a conductive material, such as tungsten (W), molybdenum (Mo), cobalt (Co), or nickel (Ni), or a semiconductor material, such as silicon (Si) or poly silicon (Poly-Si), or may be formed of various other metal materials. The insulating layers IS may be formed of an oxide layer or a silicon oxide layer.

The string ST may be formed of a cell plug CPL that passes through the stack structure STK. For example, the string ST may include the cell plug CPL that is perpendicular to the source line SL. The cell plug CPL may include a blocking layer BX, a charge trap layer CT, a tunnel isolation layer TX, a channel layer CH, a core pillar CP, and a capping layer CAP. For example, the blocking layer BX may be formed in a cylindrical shape, passing through the stack structure STK, and may be formed of an oxide layer or a silicon oxide layer. The charge trap layer CT may be formed in a cylindrical shape along an inner wall of the blocking layer BX and may be formed of a nitride layer. The tunnel isolation layer TX may be formed in a cylindrical shape along an inner wall of the charge trap layer CT and may be formed of an oxide layer or a silicon oxide layer. The channel layer CH may be formed in a cylindrical shape along an inner wall of the tunnel isolation layer TX and may be formed of poly silicon. The core pillar CP may be formed in a cylindrical shape, filling the interior of the channel layer CH, and may be formed of an insulating material, such as an oxide layer or a silicon oxide layer. The capping layer CAP may be formed on the core pillar CP and may be formed of a conductive material. When the capping layer CAP is formed on the core pillar CP, a height of an upper surface of the core pillar CP may be formed to be lower than a height of an upper surface of the channel layer CH, and the capping layer CAP may be formed in an area that is surrounded by the core pillar CP and the channel layer CH.

A bit line contact BC and the first bit line BL1 may be formed on the cell plug CPL. The bit line contact BC may be formed of a conductive material and may be in contact with the channel layer CH that is included in the cell plug CPL. The first bit line BL1 may be formed on the bit line contact BC and may be formed of a conductive material.

A portion of the cell plug CPL, corresponding to the same layer as the first to n-th word lines WL1 to WLn, may be the memory cells. When describing a layout of the first memory cell F1 that is connected to the first word line WL1 with reference to FIG. 6, the first memory cell F1 may be surrounded by the first word line WL1. The first memory cell F1 may include the core pillar CP that is formed in a cylindrical shape, the channel layer CH surrounding the core pillar CP, the tunnel isolation layer TX surrounding the channel layer CH, the charge trap layer CT surrounding the tunnel isolation layer TX, and the blocking layer BX surrounding the charge trap layer CT. The blocking layer BX may be formed between the charge trap layer CT and the first word line WL1 and may be used to electrically block the charge trap layer CT from the first word line WL1. The charge trap layer CT may be used to trap electrons. During the program operation, when the electrons are trapped in the charge trap layer CT, a threshold voltage of the first memory cell F1 may increase, and when the threshold voltage increases to a target voltage, the program operation of the first memory cell F1 may be completed. The tunnel isolation layer TX may electrically block the charge trap layer CT from the channel layer CH, and when a voltage difference between the first word line WL1 and the channel layer CH becomes higher than a specific level, the tunnel isolation layer TX may be used as a path through which an electron is tunneled. The channel layer CH may be used as a layer in which a channel through which carriers may move during the program or read operation is formed. In addition, the channel layer CH may be used to increase a channel voltage in order to prevent a threshold voltage of the memory cells that are included in the unselected strings from being changed by the pass voltage during the read operation. Increasing the channel voltage of the unselected strings is referred to as channel boosting. The channel boosting will be specifically described through the next figure, FIG. 7.

Figure 7:
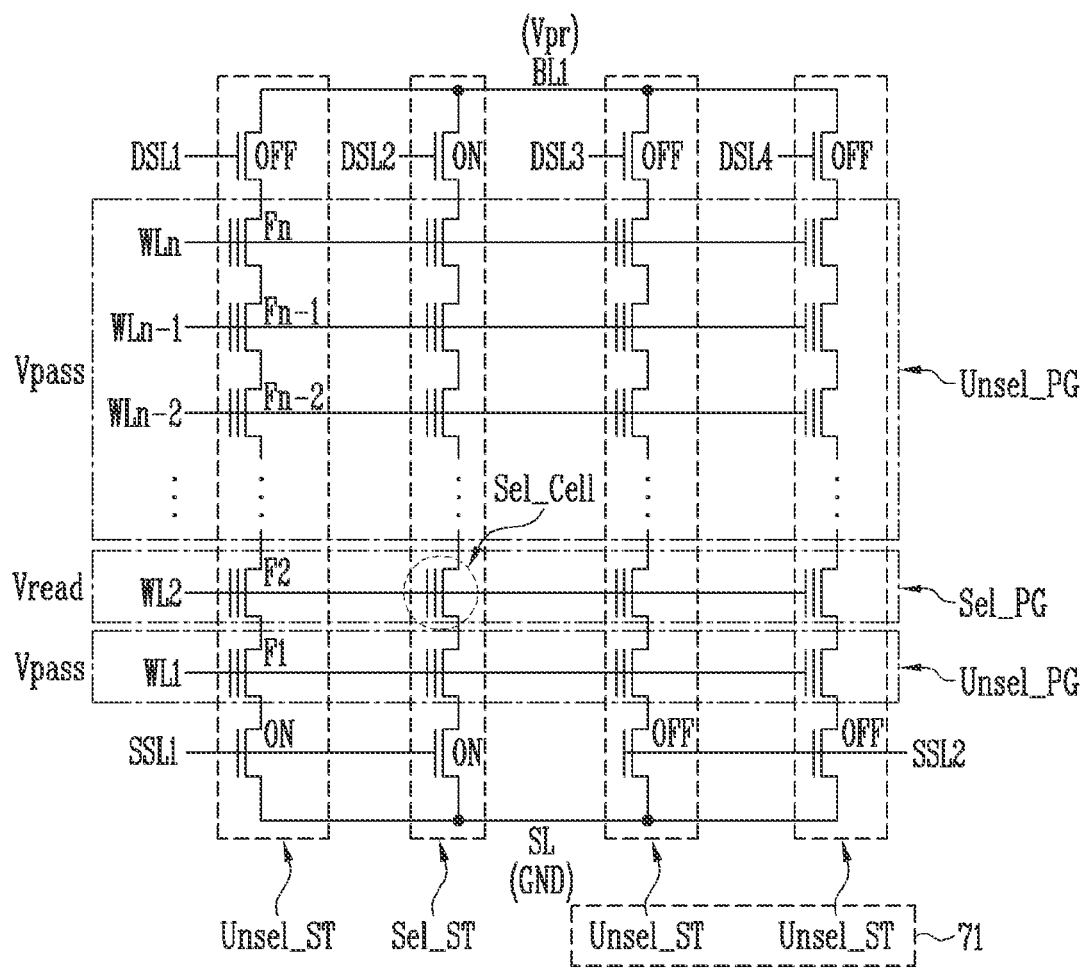
FIG. 7 is a diagram illustrating channel boosting of unselected strings during a read operation.

FIG. 7 is a diagram illustrating the channel boosting of the unselected strings during the read operation.

Referring to FIG. 7, it is assumed that a second word line WL2 is selected among the first to n-th word lines WL1 to WLn and the second drain select line DSL2 is the selected drain select line among the first to fourth drain select lines DSL1 to DSL4 during the read operation.

Since the second word line WL2 is the selected word line, second memory cells F2 that are connected to the second word line WL2 may become selected page Sel_PG. Among the second memory cells F2, a memory cell that is connected to the second drain select line DSL2 may become a selected memory cell Sel_Cell, and the remaining second memory cells F2 may become unselected memory cells.

During the read operation, a precharge voltage Vpr may be applied to the first bit line BL1, and a ground voltage GND may be applied to the source line SL. The ground voltage GND may be a 0V voltage. A turn on voltage may be applied to the second drain select line DSL2, which is the selected drain select line, and a turn off voltage may be applied to the first, third, and fourth drain select lines DSL1, DSL3, and DSL4, which are the unselected drain select lines after the turn on voltage is applied to the first, third, and fourth drain select lines DSL1, DSL3, and DSL4. Accordingly, a drain select transistor that is connected to the second drain select line DSL2 may be turned on (ON), and drain select transistors that are connected to the first, third, and fourth drain select lines DSL1, DSL3, and DSL4 may be turned on and then turned off again (OFF). A read voltage Vread may be applied to the second word line WL2, which is the selected word line, and a pass voltage Vpass that is higher than the read voltage Vread may be applied to the first and third to n-th word lines WL1 and WL3 to WLn, which are the unselected word lines. The turn on voltage may be applied to the first source select line SSL1 that is connected to the selected string, including the selected memory cell Sel_Cell, and the turn off voltage may be applied to the second source select line SSL2 that is connected to the unselected strings, including only the unselected memory cells. Therefore, source select transistors that are connected to the first source select line SSL1 may be turned on (ON), and source select transistors that are connected to the second source select line SSL2 may be turned off (OFF). In strings 71 in which both a drain select transistor and a source select transistor of unselected strings are turned off, a channel boosting may occur due to a coupling between a channel to which the precharge voltage Vpr is applied and the unselected word lines to which the pass voltage Vpass is applied.

When the channel boosting occurs in the unselected strings, hot carrier injection may occur due to a voltage difference between the read voltage Vread that is applied to the selected word line and a channel of the unselected strings. The hot carrier injection is a phenomenon in which an electron is input to the unselected memory cells. In particular, when an electron is trapped in the tunnel isolation layer TX of FIG. 6 of the memory cell due to the hot carrier injection, removing the electron that is trapped in the tunnel isolation layer TX through the program or erase operation may be difficult. As described above, since the hot carrier injection may reduce reliability of the program and read operations of the memory cells, the present embodiment provides a memory device and a method of operating the same capable of preventing occurrence of the hot carrier injection. Specifically, in the present embodiment, a read operation of the memory device is proposed.

Figure 8:
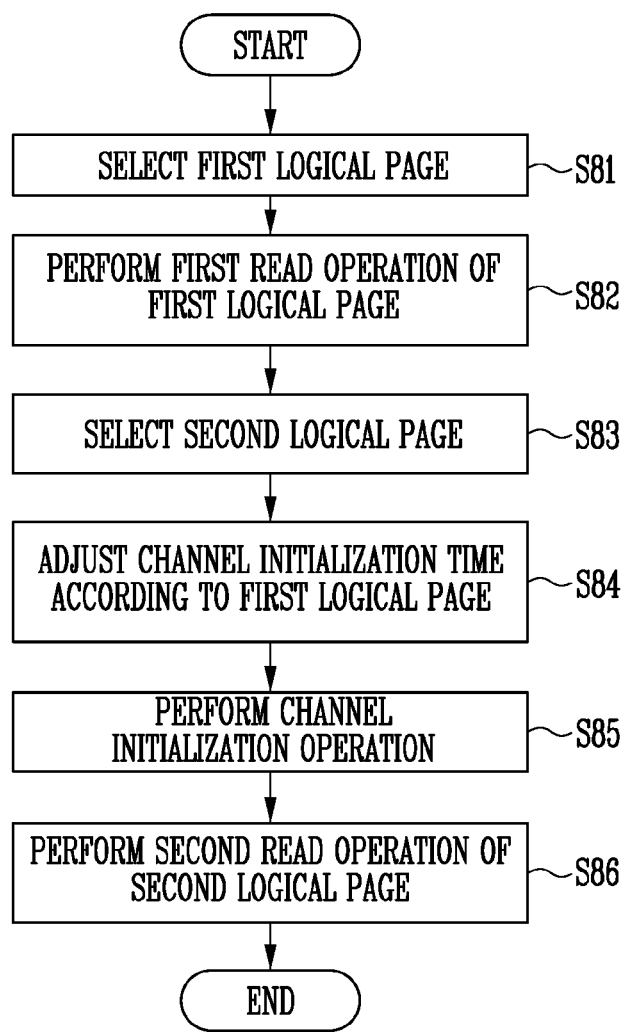
FIG. 8 is a flowchart illustrating a read operation according to a first embodiment of the present disclosure.

FIG. 8 is a flowchart illustrating a read operation according to a first embodiment of the present disclosure.

Referring to FIG. 8, a read operation of a selected page in which data including a plurality of logical pages is stored may be performed in a logical page unit. For example, when two bits of data configured of first and second logical pages are stored in the memory cell, a second read operation on the second logical page may be performed after a first read operation on the first logical page is performed, or the first read operation on the first logical page may be performed after the second read operation on the second logical page is performed. In FIG. 8, a read operation in which the first read operation on the first logical page is performed before the second read operation on the second logical page is shown as an embodiment.

When the read operation of the selected page is started, the first logical page may be selected (S81), and the first read operation using a first read voltage corresponding to the first logical page may be performed (S82). When the first read operation is completed, the second logical page may be selected (S83).

When the second logical page is selected, the control logic 130 of FIG. 1 may adjust the channel initialization time according to the logical page that is selected in the read operation S82 of the previous step (S84). Since the read operation of the previous step S82 is performed on the first logical page, the control logic 130 may adjust the channel initialization time according to the first logical page. For example, the control logic 130 may compare the first read voltage corresponding to the first logic page to a reference voltage and may adjust the channel initialization time according to a comparison result. The reference voltage may be a second read voltage corresponding to the second logic page. For example, when the first read voltage corresponding to the first logical page is lower than the second read voltage corresponding to the second logical page, the control logic 130 may set the channel initialization time to a time that is longer than a default time. For example, when the first read voltage corresponding to the first logical page is higher than the second read voltage corresponding to the second logical page, the control logic 130 may maintain the channel initialization time to be equal to the default time. The default time may be a time basically set in the memory device.

When the channel initialization time is determined, the channel initialization operation of the unselected strings may be performed during the channel initialization time that is determined in step S84 (S85). The channel initialization operation may be an operation of discharging the channel in order to prevent the hot carrier injection from occurring in the channel. For example, when the source line to which the ground voltage is applied is connected to the channel layer, the channel layer may be discharged. That is, by electrically connecting the channel layer to the bit line and the source line, a current may flow through the channel layer between the bit line and the source line, thereby discharging the channel layer. When the channel layers of the unselected strings are discharged, since an electric potential of the channel layer is lowered, the hot carrier injection may be prevented.

After the channel initialization operation is performed, the second read operation, using the second read voltage, corresponding to the second logical page, may be performed (S86).

Figure 9:
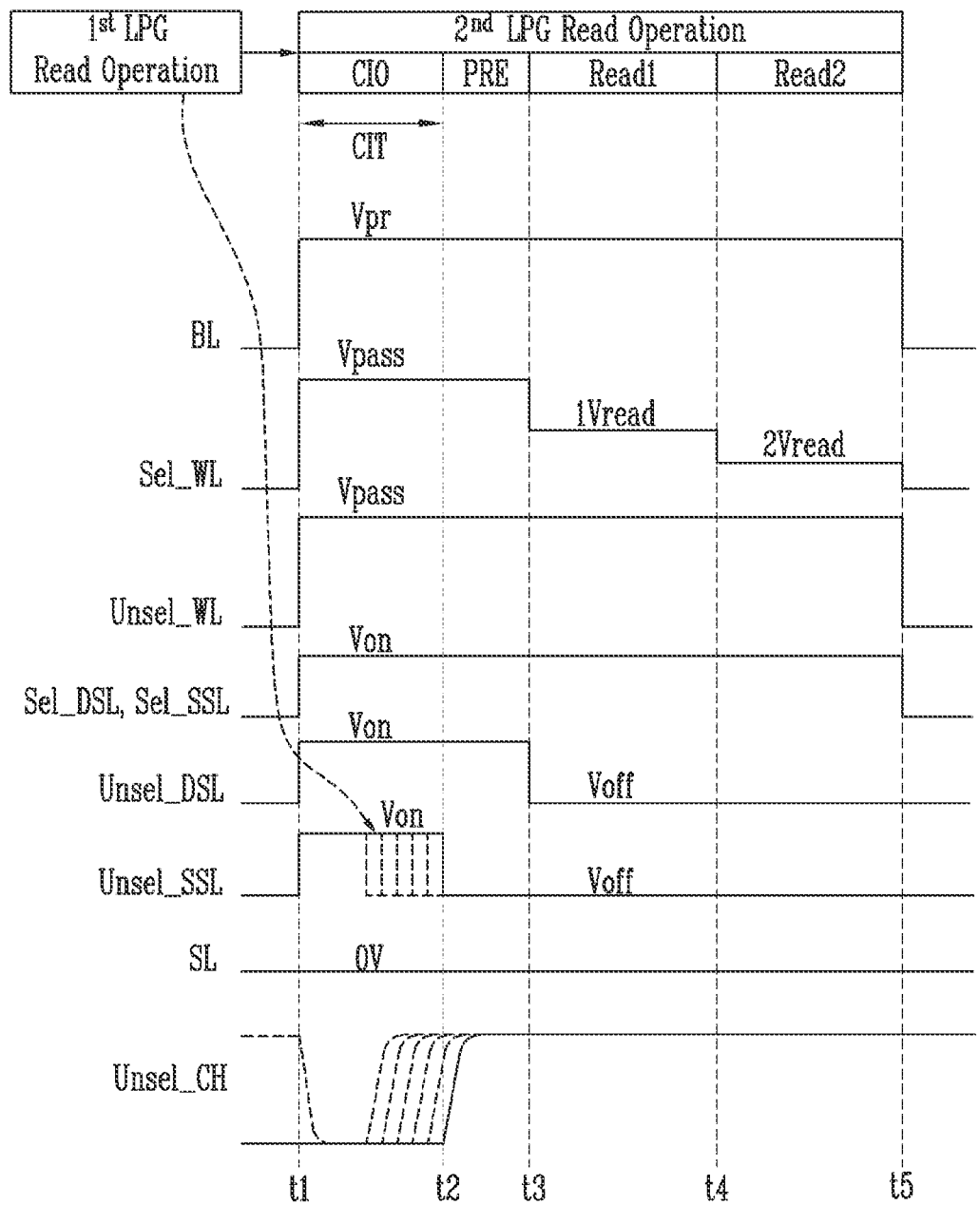
FIG. 9 is a timing diagram illustrating a read operation according to a first embodiment of the present disclosure.

FIG. 9 is a timing diagram illustrating the read operation according to the first embodiment of the present disclosure.

Referring to FIG. 9, according to the first embodiment of the present disclosure, when a read operation of a first logical page 1st LPG is ended and a read operation of a second logical page 2nd LPG is performed, a channel initializing time CIT may be adjusted according to the first logical page 1st LPG corresponding to the previous logical page. The first and second logical pages 1st LPG and 2nd LPG may refer to data of the logical page that is stored in the selected page. The read operation of the second logical page 2nd LPG is specifically described as follows.

In the read operation of the second logical page 2nd LPG, the channel initialization operation CIO, the precharge operation PRE, the first read operation Read1, and the second read operation Read2 may be sequentially performed. The channel initialization operation CIO may be a step for lowering the channel potential of the strings and may be performed during the channel initialization time CIT. The precharge operation PRE may be an operation of precharging the bit lines. For example, in the precharge operation PRE, a positive voltage of precharge voltage may be applied to the bit lines. The first and second read operations Read1 and Read2 may be operations for reading data of the second logical page 2nd LPG, and different read voltages may be used in order to read the data of the second logical page 2nd LPG. For example, a first read voltage 1Vread may be used in the first read operation Read1, and a second read voltage 2Vread that is different from the first read voltage 1Vread may be used in the second read operation Read2. The operations CIO, PRE, Read1, and Read2 that are performed in the read operation of the second logical page 2nd LPG are specifically described as follows.

In the read operation of the second logical page 2nd LPG, the channel initialization operation CIO, the precharge operation PRE, the first read operation 1Read1, and the second read operation Read2 may be sequentially performed. The channel initialization operation CIO may be a step for lowering the channel potential of the strings and may be performed during the channel initialization time CIT. The precharge operation PRE may be an operation of precharging the bit lines. For example, in the precharge operation PRE, a positive voltage of precharge voltage may be applied to the bit lines. The first and second read operations Read1 and Read2 may be operations for reading data of the second logical page 2nd LPG, and different read voltages may be used in order to read the data of the second logical page 2nd LPG. For example, a first read voltage 1Vread may be used in the first read operation Read1, and a second read voltage 2Vread that is different from the first read voltage 1Vread may be used in the second read operation Read2. The operations CIO, PRE, Read1, and Read2 that are performed in the read operation of the second logical page 2nd LPG are specifically described as follows.

The channel initialization operation CIO may be performed in a period t1 to t2. In the period t1 to t2, the precharge voltage Vpr may be applied to the bit lines BL, and the pass voltage Vpass may be applied to the selected word line Sel_WL and the unselected word lines Unsel_WL. The pre-charge voltage Vpr may be a voltage for precharging the bit lines BL but may be used to increase the current of the channel layers in the channel initialization operation CIO. The precharge voltage Vpr may be set to a positive voltage higher than 0V. The pass voltage Vpass may be a voltage for forming the channel in the channel layers of the strings and may be set to a positive voltage at which the unselected memory cells may be turned on. The pass voltage Vpass has a level that is higher than the first and second read voltages 1Vread and 2Vread to turn on all unselected memory cells. The ground voltage may be supplied to the source line SL while the read operation of the second logical page 2nd LPG is performed. For example, the ground voltage may be a 0V voltage.

In the period t1 to t2, a positive voltage of turn on voltage Von may be applied to the selected drain select line Sel_DSL, the selected source select line Sel_SSL, and the unselected drain select line Unsel_DSL. The selected drain select transistor, the selected source select transistor, and the unselected drain select transistor may be turned on by the turn on voltage Von. At this time, for the channel initialization operation CIO, the turn on voltage Von may be applied to the unselected source select line Unsel_SSL. That is, since all drain select transistors and source select transistors are turned on in the period t1 to t2 in which the channel initialization operation is performed, a voltage of the unselected channel layer Unsel_CH may be lowered. In a period before t1, the voltage of the unselected channel layer Unsel_CH may have a different level according to the read operation of the first logical page 1st LPG.

The turn on voltage Von that is applied to the unselected source select line Unsel_SSL may be applied during the channel initialization time CIT in which the channel initialization operation CIO is performed. That is, t2, which is an end time of the channel initialization operation CIO, may be determined according to the channel initialization time CIT. The channel initialization time CIT may be adjusted according to the first logical page 1st LPG of the read operation that is performed in the previous step. For example, when a lowest read voltage, among the read voltages that are used in the read operation of the first logical page 1st LPG, is lower than a lowest read voltage, among the read voltages that are used in the read operation of the second logical page 2nd LPG, the channel initialization time CIT may be adjusted to be longer than a default time. On the other hand, when the lowest read voltage, among the read voltages that are used in the read operation of the first logical page 1st LPG, is higher than the lowest read voltage, among the read voltages that are used in the read operation of the second logical page 2nd LPG, the channel initialization time CIT may be maintained at the default time or may be adjusted to be shorter than the default time.

The reason for comparing the lowest read voltages with each other is that the number of turned off memory cells in the selected page increases as the read voltage decreases. When the turned off memory cell exists in the string, the channel layer of the string may float, and thus, channel boosting may occur. When a level of the channel boosting increases, the hot carrier injection may occur in the turned off memory cell. Therefore, since a probability of the occurrence of the hot carrier injection increases as the read voltage decreases, the control logic 130 of FIG. 1 may control the channel initialization time CIT to be increased when a read operation of a subsequent page is performed after a read operation of a logical page corresponding to a low read voltage is performed.

When the channel initialization operation CIO is ended, the precharge operation PRE for precharging the bit lines BL may be performed. The precharge operation PRE may be performed in a period t2 to t3. In the period t2 to t3, a turn off voltage Voff may be applied to the unselected source select line Unsel_SSL. When the turn off voltage Voff is applied to the unselected source select line Unsel_SSL, the unselected source select transistor may be turned off, and thus, the unselected channel layer Unsel_CH may be precharged by the precharge voltage Vpr that is supplied through the bit line BL.

When the precharge operation PRE is ended, the first read operation Read1 may be performed in a period t3 to t4. When the first read operation Read1 is started, the first read voltage 1Vread may be applied to the selected word line Sel_WL and the turn off voltage Voff may be applied to the unselected drain select line Unsel_DSL. The first read voltage 1Vread may be a voltage for reading the data of the second logical page 2nd LPG.

When data read by the first read voltage 1Vread in the first read operation Read1 is stored in the page buffers, the second read operation Read2 may be performed in a period t4 to t5. When the second read operation Read2 is started, the second read voltage 2Vread may be applied to the selected word line Sel_WL. The second read voltage 2Vread may be a voltage for reading the data of the second logical page 2nd LPG and may have a level that is lower than the first read voltage 1Vread. A read operation of the triple level method to which the above-described first embodiment is applied is described as follows.

Figure 10:
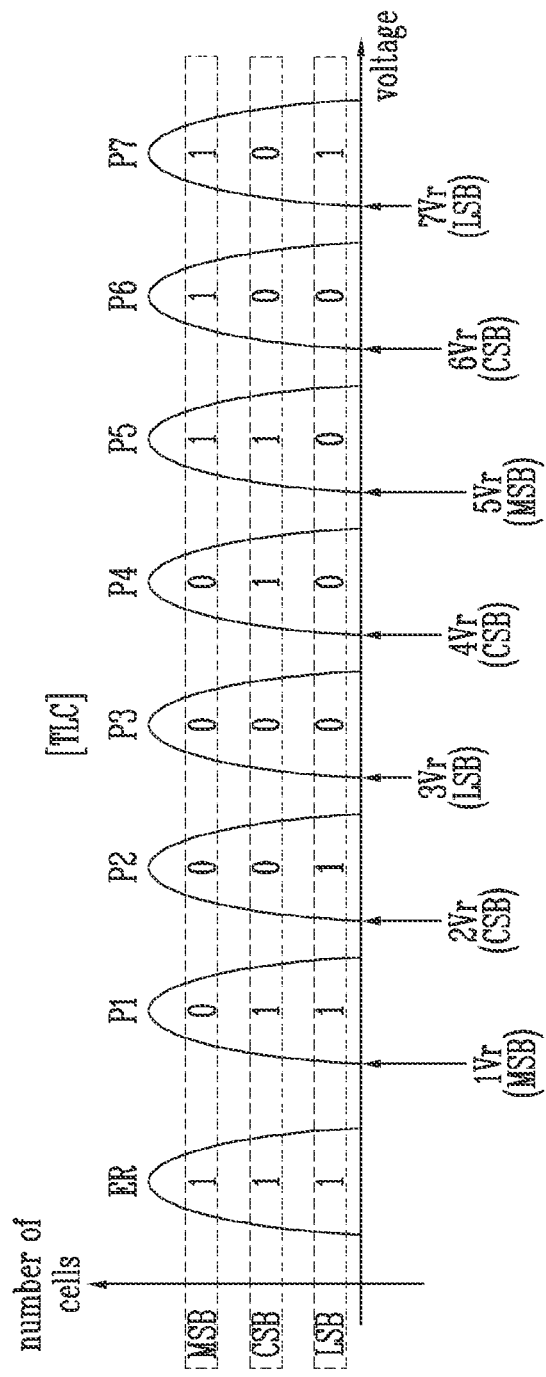
FIG. 10 is a diagram illustrating a logical page of memory cells programmed in a triple level cell (TLC) method.

FIG. 10 is a diagram illustrating a logical page of memory cells programmed in the triple level cell method.

Referring to FIG. 10, in the triple level cell TLC method, the memory cells may be in an erase state ER or may be programmed into any one of first to seventh program states P1 to P7. For example, in the program operation, the memory cells may store data including three bits according to a predetermined gray code. The three bits may be divided into different logical page data. For example, the three bits may include least significant bit (LSB), central significant bit (CSB), and most significant bit (MSB) page data. That is, the respective LSB page data, CSB page data, and MSB page data may be different logical page data. Therefore, the LSB page data, the CSB page data, and the MSB page data, which are different logical page data, may be stored in one physical page.

A read operation of a memory page that is programmed in the TLC method may also be performed in the TLC method. In the read operation, seven different first to seventh read voltages 1Vr to 7Vr may be used to read memory cells having eight different threshold voltages. For example, the first and fifth read voltages 1Vr and 5Vr may be voltages for reading data of the MSB page, the second, fourth, and sixth read voltages 2Vr, 4Vr, and 6Vr may be voltages for reading data of the CSB page data, and the third and seventh read voltages 3Vr and 7Vr may be voltages for reading data of the LSB page. Read voltages corresponding to the data of the LSB, the CSB, and the MSB pages may vary according to a gray code.

The read operation may be performed in units of the LSB page, the CSB page, and the MSB page. For example, in the read operation of the LSB page, a read operation using the third read voltage 3Vr and a read operation using the seventh read voltage 7Vr may be performed. In the read operation of the CSB page, a read operation using the second read voltage 2Vr, a read operation using the fourth read voltage 4Vr, and a read operation using the sixth read voltage 6Vr may be performed. In the read operation of the MSB page, a read operation using the first read voltage 1Vr and a read operation using the fifth read voltage 5Vr may be performed. For example, after the read operation of the LSB page is performed, the read operation of the CSB page may be performed, and after the read operation of the CSB page is performed, the read operation of the MSB page may be finally performed. The order in which the read operations of the LSB, the CSB, and the MSB pages are performed may be changed.

In the embodiment, described with reference to FIG. 10, since the lowest first read voltage 1Vr is used in the read operation of the MSB page, the second read voltage 2Vr is used in the read operation of the CSB page, and the third read voltage 3Vr is used in the read operation of the LSB page, the probability of the occurrence of the hot carrier injection in the read operation of the MSB page may be the highest. For example, the logical page having the highest probability of the occurrence of the hot carrier injection is the MSB page, and the page having the lowest probability of the occurrence of the hot carrier injection is the LSB page. Therefore, the probability of the occurrence of the hot carrier Injection in the CSB page may be intermediate, between the probability of the occurrence of the hot carrier injection in the MSB page and the probability of the occurrence of the hot carrier injection in the LSB page. Therefore, according to the present embodiment, the control logic 130 of FIG. 1 may set the channel initialization time to be longer than the default time after a read operation of a logical page of a relatively high probability of the occurrence of the hot carrier injection is performed. The channel initialization time set in the read operation of the TLC method is specifically described with reference to FIG. 11.

FIG. 11 is a diagram illustrating the channel initialization time set according to the logical page in the read operation of the TLC method.

Referring to FIGS. 11 and 10, the control logic 130 of FIG. 1 may store a channel initialization time table CIT_T. The channel initialization time table CIT_T may include the channel initialization time CIT corresponding to each of the logical pages LSB, CSB, and MSB. Therefore, the control logic may refer to the channel initialization time table CIT_T to set the channel initialization time CIT according to the logic page of the read operation that has been previously performed during the read operation.

For example, in the TLC method, since the probability of the occurrence of the hot carrier injection is lowest in the read operation of the LSB page, a first channel initialization time 1CIT, which is the shortest among the channel initialization times, may be mapped to the LSB page. A second channel initialization time 2CIT that is longer than the first channel initialization time 1CIT may be mapped to the CSB page, which has a higher probability of the occurrence of the hot carrier injection than that of the LSB page. A third channel initialization time 3CIT, which is the longest among the channel initialization times, may be mapped to the MSB page, which has a higher probability of the occurrence of the hot carrier injection than that of the CSB page.

Various embodiments of setting the channel initialization time CIT according to an order of the read operation of the logical page is described as follows.

Figure 12A:
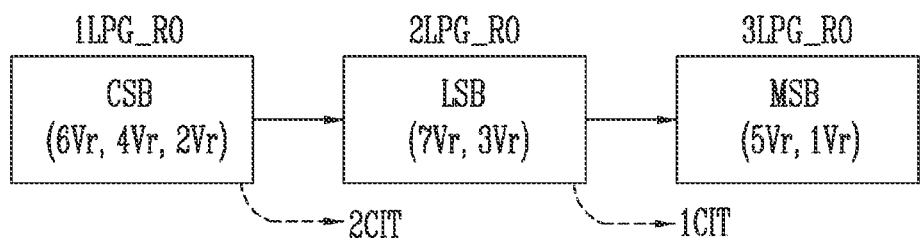
FIGS. 12A to 12C are diagrams illustrating read operations of the TLC method.
Figure 12B:
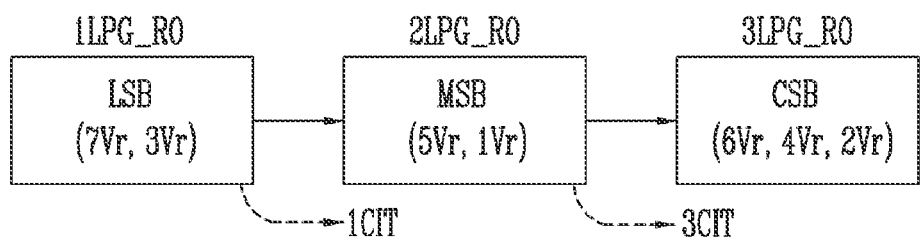
Figure 12C:
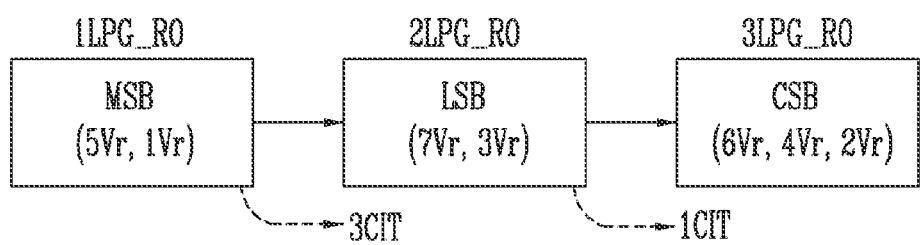

FIGS. 12A to 12C are diagrams illustrating the read operations of the TLC method.

Referring to FIGS. 12A and 11, since the data including the logical pages of the LSB page, the CSB page, and the MSB page are stored in the memory cells that are programmed in the TLC method, the read operation may be performed on each of the logical pages. For example, first to third logical page read operations 1LPG_RO to 3LPG_RO may be sequentially performed. The order in which the logical pages are selected in the first to third logical page read operations 1LPG_RO to 3LPG_RO may be changed.

In an embodiment, shown in FIG. 12A, the first logical page read operation 1LPG_RO may be the read operation of the CSB page, the second logical page read operation 2LPG_RO that is performed after the first logical page read operation 1LPG_RO may be the read operation of the LSB page, and the third logical page read operation 3LPG_RO that is performed after the second logical page read operation 2LPG_RO may be the read operation of the MSB page.

Therefore, in the first logical page read operation 1LPG_RO, the read operations using the sixth, fourth, and second read voltages 6Vr, 4Vr, and 2Vr corresponding to the CSB page may be sequentially performed. When the first logical page read operation 1LPG_RO is completed, the second logical page read operation 2LPG_RO may be performed.

In the second logical page read operation 2LPG_RO, the channel initialization time CIT may be determined according to the logical page of the first logical page read operation 1LPG_RO. Since the second channel initialization time 2CIT is mapped to the CSB page according to the channel initialization time table CIT_T, the channel initialization operation may be performed during the second channel initialization time 2CIT in the second logical page read operation 2LPG_RO. After the channel initialization operation is ended, the read operations using the seventh and third read voltages 7Vr and 3Vr corresponding to the LSB page may be sequentially performed in the second logical page read operation 2LPG_RO. When the second logical page read operation 2LPG_RO is completed, the third logical page read operation 3LPG_RO may be performed.

In the third logical page read operation 3LPG_RO, the channel initialization time CIT may be determined according to the logical page of the second logical page read operation 2LPG_RO. Since the first channel initialization time 1CIT is mapped to the LSB page according to the channel initialization time table CIT_T, the channel initialization operation may be performed during the first channel initialization time 1CIT in the third logical page read operation 3LPG_RO. After the channel initialization operation is ended, in the third logical page read operation 3LPG_RO, the read operations using the fifth and first read voltages 5Vr and 1Vr corresponding to the MSB page may be sequentially performed.

Referring to FIGS. 12B and 11, the first logical page read operation 1LPG_RO may be the read operation of the LSB page, the second logical page read operation 2LPG_RO that is performed after the first logical page read operation 1LPG_RO may be the read operation of the MSB page, and the third logical page read operation 3LPG_RO that is performed after the second logical page read operation 2LPG_RO may be the read operation of the CSB page.

In the first logical page read operation 1LPG_RO, read operations using the seventh and third read voltages 7Vr and 3Vr corresponding to the LSB page may be sequentially performed. When the first logical page read operation 1LPG_RO is completed, the second logical page read operation 2LPG_RO may be performed.

In the second logical page read operation 2LPG_RO, the channel initialization time CIT may be determined according to the logical page of the first logical page read operation 1LPG_RO. Since the first channel initialization time 1CIT is mapped to the LSB page according to the channel initialization time table CIT_T, the channel initialization operation may be performed during the first channel initialization time 1CIT in the second logical page read operation 2LPG_RO. After the channel initialization operation is ended, in the second logical page read operation 2LPG_RO, read operations using the fifth and first read voltages 5Vr and 1Vr corresponding to the MSB page may be sequentially performed. When the second logical page read operation 2LPG_RO is completed, the third logical page read operation 3LPG_RO may be performed.

In the third logical page read operation 3LPG_RO, the channel initialization time CIT may be determined according to the logical page of the second logical page read operation 2LPG_RO. Since the third channel initialization time 3CIT is mapped to the MSB page according to the channel initialization time table CIT_T, the channel initialization operation may be performed during the third channel initialization time 3CIT in the third logical page read operation 3LPG_RO. After the channel initialization operation is ended, in the third logical page read operation 3LPG_RO, read operations using the sixth, fourth, and second read voltages 6Vr, 4Vr, and 2Vr corresponding to the CSB page may be sequentially performed.

Referring to FIGS. 12C and 11, the first logical page read operation 1LPG_RO may be the read operation of the MSB page, the second logical page read operation 2LPG_RO that is performed after the first logical page read operation 1LPG_RO may be the read operation of the LSB page, and the third logical page read operation 3LPG_RO that is performed after the second logical page read operation 2LPG_RO may be the read operation of the CSB page.

In the first logical page read operation 1LPG_RO, the read operations using the fifth and first read voltages 5Vr and 1Vr corresponding to the MSB page may be sequentially performed. When the first logical page read operation 1LPG_RO is completed, the second logical page read operation 2LPG_RO may be performed.

In the second logical page read operation 2LPG_RO, the channel initialization time CIT may be determined according to the logical page of the first logical page read operation 1LPG_RO. Since the third channel initialization time 3CIT is mapped to the MSB page according to the channel initialization time table CIT_T, the channel initialization operation may be performed during the third channel initialization time 3CIT in the second logical page read operation 2LPG_RO. After the channel initialization operation is ended, the read operations using the seventh and third read voltages 7Vr and 3Vr corresponding to the LSB page may be sequentially performed in the second logical page read operation 2LPG_RO. When the second logical page read operation 2LPG_RO is completed, the third logical page read operation 3LPG_RO may be performed.

In the third logical page read operation 3LPG_RO, the channel initialization time CIT may be determined according to the logical page of the second logical page read operation 2LPG_RO. Since the first channel initialization time 1CIT is mapped to the LSB page according to the channel initialization time table CIT_T, the channel initialization operation may be performed during the first channel initialization time 1CIT in the third logical page read operation 3LPG_RO. After the channel initialization operation is ended, in the third logical page read operation 3LPG_RO, the read operations using the sixth, fourth, and second read voltages 6Vr, 4Vr, and 2Vr corresponding to the CSB page may be sequentially performed.

The read operations may be performed in various orders other than the embodiments described with reference to FIGS. 12A to 12C. The above-described embodiments may also be applied to a method in which the number of bits that are stored in the memory cell is greater than that of the TLC method. As an embodiment, a read operation of memory cells programmed in a quad level cell method is described as follows.

Figure 13:
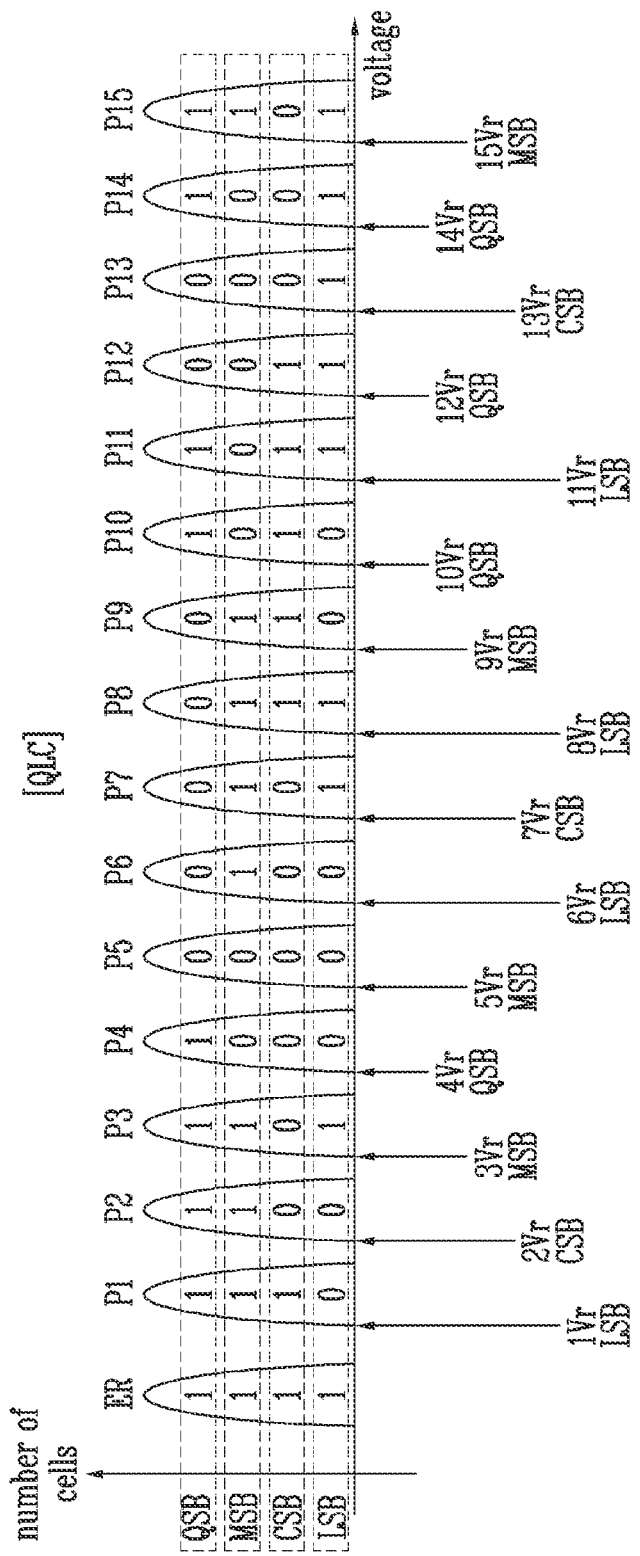
FIG. 13 is a diagram illustrating a logical page of the memory cells programmed in a quad level cell (QLC) method.

FIG. 13 is a diagram illustrating the logical page of the memory cells programmed in the quad level cell method.

Referring to FIG. 13, in the quad level cell (QLC) method, the memory cells may be in an erase state ER or may be programmed into any one of first to fifteenth program states P1 to P15. For example, in the program operation, the memory cells may store data including four bits according to a predetermined gray code. The four bits may be divided into different logical page data. For example, the four bits may include LSB, CSB, MSB, and quad significant bit (QSB) page data. That is, the respective LSB page data, CSB page data, MSB page data, and QSB page data are different logical page data. Therefore, the LSB page data, the CSB page data, the MSB page data, and the QSB data, which are different logical page data, may be stored in one physical page.

The read operation of the memory page that is programmed in the QLC method may also be performed in the QLC method. In the read operation, 15 different first to fifteenth read voltages 1Vr to 15Vr may be used to read memory cells having 16 different threshold voltages. For example, the first, sixth, eighth, and eleventh read voltages 1Vr, 6Vr, 8Vr, and 11Vr are voltages for reading data of an LSB page, second, seventh, and thirteenth read voltages 2Vr, 7Vr, and 13Vr are voltages for reading data of a CSB page, the third, fifth, ninth, and fifteenth read voltages 3Vr, 5Vr, 9Vr, and 15Vr are voltages for reading data of an MSB page, and the fourth, tenth, twelfth, and fourteenth read voltages 4Vr, 10Vr, 12Vr, and 14Vr are voltages for reading data of a QSB page. The read voltages corresponding to data of the LSB, CSB, MSB, and QSB pages may vary according to a gray code.

The read operation may be performed in units of the LSB page, the CSB page, the MSB page, and the QSB page. For example, in the read operation of the LSB page, a read operation using the first read voltage 1Vr, a read operation using the sixth read voltage 6Vr, a read operation using the eighth read voltage 8Vr, and a read operation using the eleventh read voltage 11Vr may be performed. In the read operation of the CSB page, a read operation using the second read voltage 2Vr, a read operation using the seventh read voltage 7Vr, and a read operation using the thirteenth read voltage 13Vr may be performed. In the read operation of the MSB page, a read operation using the third read voltage 3Vr, a read operation using the fifth read voltage 5Vr, a read operation using the ninth read voltage 9Vr, and a read operation using the fifteenth read voltage 15Vr may be performed. In the read operation of the QSB page, a read operation using the fourth read voltage 4Vr, a read operation using the tenth read voltage 10Vr, a read operation using the twelfth read voltage 12Vr, and a read operation using the fourteenth read voltage 14Vr may be performed. For example, the read operation of the CSB page may be performed after the read operation of the LSB page is performed, the read operation of the MSB page may be performed after the read operation of the CSB page is performed, and the read operation of the QSB page may be performed after the read operation of the MSB page is performed. An order in which the read operations of the LSB, CSB, MSB, and QSB pages are performed may be changed.

In the embodiment, described with reference to FIG. 13, since the lowest first read voltage 1Vr is used in the read operation of the LSB page, the second read voltage 2Vr is used in the read operation of the CSB page, the third read voltage 3Vr is used in the read operation of the MSB page, and the fourth read voltage 4Vr is used in the read operation of the QSB page, the probability of the occurrence of the hot carrier injection in the read operation of the LSB page is highest. For example, a logical page having the highest probability of the occurrence of the hot carrier injection is the LSB page, a logical page having a probability of the occurrence of the hot carrier injection lower than that of LSB page is the CSB page, a logical page having a probability of the occurrence of the hot carrier injection lower than that of the CSB page is the MSB page, and a logical page having the lowest probability of the occurrence of the hot carrier injection is the QSB page. Therefore, the control logic 130 of FIG. 1 may set the channel initialization time to be increased as the probability of the occurrence of the hot carrier injection of the read operation performed in the previous step increases. The channel initialization time set in the read operation of the QLC method is specifically described with reference to FIG. 14.

FIG. 14 is a diagram illustrating the channel initialization time set according to the logical page in the read operation of the QLC method.

Referring to FIGS. 14 and 13, the control logic 130 of FIG. 1 may store the channel initializing time table CIT_T. The channel initialization time table CIT_T may include the channel initialization time CIT corresponding to each of the logical pages LSB, CSB, MSB, and QSB. Therefore, the control logic may refer to the channel initialization time table CIT_T to set the channel initialization time CIT according to the logic page of the read operation previously performed during the read operation.

For example, in the QLC method, since the probability of the occurrence of hot carrier injection in the read operation of the QSB page is the lowest, the first channel initialization time 1CIT, which is the shorted among the channel initialization times, may be mapped to the QSB page. A second channel initialization time 2CIT longer than the first channel initialization time 1CIT may be mapped to the MSB page, which has a higher probability of the occurrence of hot carrier injection than that of the QSB page. A third channel initialization time 3CIT longer than the second channel initialization time 2CIT may be mapped to the CSB page, which has a higher probability of the occurrence of hot carrier injection than that of the MSB page. A fourth channel initialization time 4CIT, which is the longest among the channel initialization times, may be mapped to the LSB page, which has a higher probability of the occurrence of hot carrier injection than that of the CSB page.

Various embodiments of setting the channel initialization time CIT according to an order of the read operation of the logical page is described as follows.

Figure 15A:
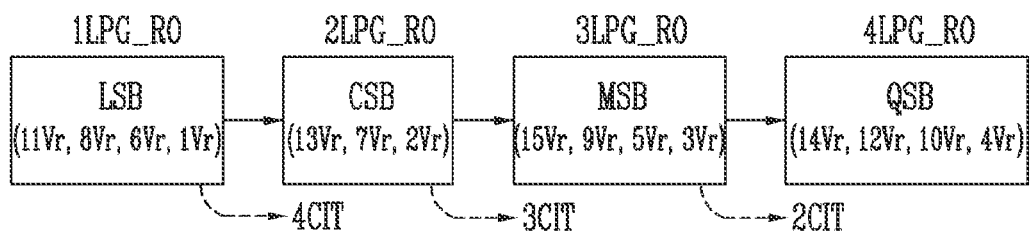
FIGS. 15A to 15C are diagrams illustrating read operations of the QLC method.
Figure 15B:
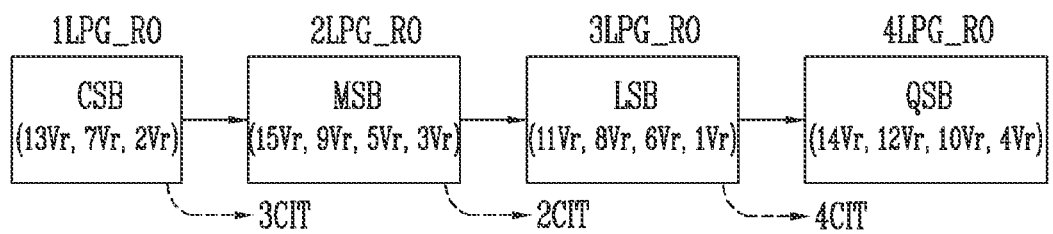
Figure 15C:
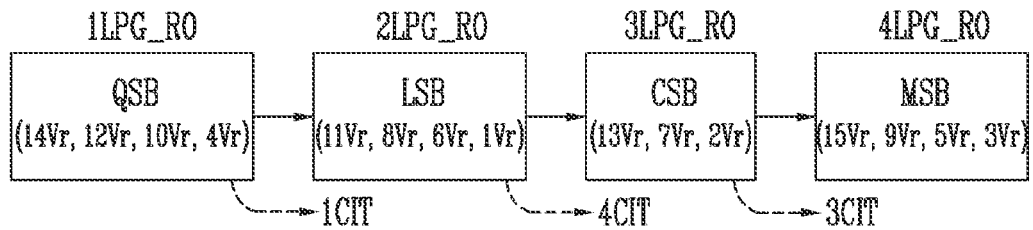

FIGS. 15A to 15C are diagrams illustrating the read operations of the QLC method.

Referring to FIGS. 15A and 14, since data including the logical pages of the LSB page, the CSB page, the MSB page, and the QSB page are stored in the memory cells that are programmed in the QLC method, the read operation may be performed on each of the logical pages. For example, first to fourth logical page read operations 1LPG_RO to 4LPG_RO may be sequentially performed. The order in which the logical pages are selected in the first to fourth logical page read operations 1LPG_RO to 4LPG_RO may be changed.

In an embodiment shown in FIG. 15A, the first logical page read operation 1LPG_RO may be the read operation of the LSB page, the second logical page read operation 2LPG_RO that is performed after the first logical page read operation 1LPG_RO may be the read operation of the CSB page, the third logical page read operation 3LPG_RO that is performed after the second logical page read operation 2LPG_RO may be the read operation of the MSB page, and the fourth logical page read operation 4LPG_RO that is performed after the third logical page read operation 3LPG_RO may be the read operation of the QSB page.

Therefore, in the first logical page read operation 1LPG_RO, read operations using the eleventh, eighth, sixth, and first read voltages 11Vr, 8Vr, 6Vr, and 1Vr corresponding to the LSB page may be sequentially performed. When the first logical page read operation 1LPG_RO is completed, the second logical page read operation 2LPG_RO may be performed.

In the second logical page read operation 2LPG_RO, the channel initialization time CIT may be determined according to the logical page of the first logical page read operation 1LPG_RO. Since the fourth channel initialization time 4CIT is mapped to the LSB page according to the channel initialization time table CIT_T, the channel initialization operation may be performed during the fourth channel initialization time 4CIT in the second logical page read operation 2LPG_RO. After the channel initialization operation is completed, in the second logical page read operation 2LPG_RO, the read operations using the thirteenth, seventh, and second read voltages 13Vr, 7Vr, and 2Vr corresponding to the CSB page may be sequentially performed. When the second logical page read operation 2LPG_RO is completed, the third logical page read operation 3LPG_RO may be performed.

In the third logical page read operation 3LPG_RO, the channel initialization time CIT may be determined according to the logical page of the second logical page read operation 2LPG_RO. Since the third channel initialization time 3CIT is mapped to the CSB page according to the channel initialization time table CIT_T, the channel initialization operation may be performed during the third channel initialization time 3CIT in the third logical page read operation 3LPG_RO. After the channel initialization operation is completed, in the third logical page read operation 3LPG_RO, the read operations using the fifteenth, ninth, fifth, and third read voltages 15Vr, 9Vr, 5Vr, and 3Vr corresponding to the MSB page may be sequentially performed. When the third logical page read operation 3LPG_RO is completed, the fourth logical page read operation 4LPG_RO may be performed.

In the fourth logical page read operation 4LPG_RO, the channel initialization time CIT may be determined according to the logical page of the third logical page read operation 3LPG_RO. Since the second channel initialization time 2CIT is mapped to the MSB page according to the channel initialization time table CIT_T, the channel initialization operation may be performed during the second channel initialization time 2CIT in the fourth logical page read operation 4LPG_RO. After the channel initialization operation is completed, in the fourth logical page read operation 4LPG_RO, the read operations using the fourteenth, twelfth, tenth, and fourth read voltages 14Vr, 12Vr, 10Vr, and 4Vr corresponding to the QSB page may be sequentially performed.

Referring to FIGS. 15B and 14, the first logical page read operation 1LPG_RO may be the read operation of the CSB page, the second logical page read operation 1LPG_RO that is performed after the first logical page read operation 1LPG_RO may be the read operation of the MSB page, the third logical page read operation 3LPG_RO that is performed after the second logical page read operation 2LPG_RO may be the read operation of the LSB page, and the fourth logical page read operation 4LPG_RO that is performed after the third logical page read operation 3LPG_RO may be the read operation of the QSB page.

Therefore, in the first logical page read operation 1LPG_RO, the read operations using the thirteenth, seventh, and second read voltages 13Vr, 7Vr, and 2Vr corresponding to the CSB page may be sequentially performed. When the first logical page read operation 1LPG_RO is completed, the second logical page read operation 2LPG_RO may be performed.

In the second logical page read operation 2LPG_RO, the channel initialization time CIT may be determined according to the logical page of the first logical page read operation 1LPG_RO. Since the third channel initialization time 3CIT is mapped to the CSB page according to the channel initialization time table CIT_T, the channel initialization operation may be performed during the third channel initialization time 3CIT in the second logical page read operation 2LPG_RO. After the channel initialization operation is completed, in the second logical page read operation 2LPG_RO, the read operations using the fifteenth, ninth, fifth, and third read voltages 15Vr, 9Vr, 5Vr, and 3Vr corresponding to the MSB page may be sequentially performed. When the second logical page read operation 2LPG_RO is completed, the third logical page read operation 3LPG_RO may be performed.

In the third logical page read operation 3LPG_RO, the channel initialization time CIT may be determined according to the logical page of the second logical page read operation 2LPG_RO. Since the second channel initialization time 2CIT is mapped to the MSB page according to the channel initialization time table CIT_T, the channel initialization operation may be performed during the second channel initialization time 2CIT in the third logical page read operation 3LPG_RO. After the channel initialization operation is completed, in the third logical page read operation 3LPG_RO, the read operations using the eleventh, eighth, sixth, and first read voltages 11Vr, 8Vr, 6Vr, and 1Vr corresponding to the LSB page may be sequentially performed. When the third logical page read operation 3LPG_RO is completed, the fourth logical page read operation 4LPG_RO may be performed.

In the fourth logical page read operation 4LPG_RO, the channel initialization time CIT may be determined according to the logical page of the third logical page read operation 3LPG_RO. Since the fourth channel initialization time 4CIT is mapped to the LSB page according to the channel initialization time table CIT_T, the channel initialization operation may be performed during the fourth channel initialization time 4CIT in the fourth logical page read operation 4LPG_RO. After the channel initialization operation is completed, in the fourth logical page read operation 4LPG_RO, the read operations using the fourteenth, twelfth, tenth, and fourth read voltages 14Vr, 12Vr, 10Vr, and 4Vr corresponding to the QSB page may be sequentially performed.

Referring to FIGS. 15C and 14, the first logical page read operation 1LPG_RO may be the read operation of the QSB page, the second logical page read operation 2LPG_RO that is performed after the first logical page read operation 1LPG_RO may be the read operation of the LSB page, the third logical page read operation 3LPG_RO that is performed after the second logical page read operation 2LPG_RO may be the read operation of the CSB page, and the fourth logical page read operation 4LPG_RO that is performed after the third logical page read operation 3LPG_RO may be the read operation of the MSB page.

Therefore, in the first logical page read operation 1LPG_RO, the read operations using the fourteenth, twelfth, tenth, and fourth read voltages 14Vr, 12Vr, 10Vr, and 4Vr corresponding to the QSB page may be sequentially performed. When the first logical page read operation 1LPG_RO is completed, the second logical page read operation 2LPG_RO may be performed.

In the second logical page read operation 2LPG_RO, the channel initialization time CIT may be determined according to the logical page of the first logical page read operation 1LPG_RO. Since the first channel initialization time 1CIT is mapped to the QSB page according to the channel initialization time table CIT_T, the channel initialization operation may be performed during the first channel initialization time 1CIT in the second logical page read operation 2LPG_RO. After the channel initialization operation is completed, in the second logical page read operation 2LPG_RO, the read operations using the eleventh, eighth, sixth, and first read voltages 11Vr, 8Vr, 6Vr, and 1Vr corresponding to the LSB page may be sequentially performed. When the second logical page read operation 2LPG_RO is completed, the third logical page read operation 3LPG_RO may be performed.

In the third logical page read operation 3LPG_RO, the channel initialization time CIT may be determined according to the logical page of the second logical page read operation 2LPG_RO. Since the fourth channel initialization time 4CIT is mapped to the LSB page according to the channel initialization time table CIT_T, the channel initialization operation may be performed during the fourth channel initialization time 4CIT in the third logical page read operation 3LPG_RO. After the channel initialization operation is completed, in the third logical page read operation 3LPG_RO, the read operations using the thirteenth, seventh, and second read voltages 13Vr, 7Vr, and 2Vr corresponding to the CSB page may be sequentially performed. When the third logical page read operation 3LPG_RO is completed, the fourth logical page read operation 4LPG_RO may be performed.

In the fourth logical page read operation 4LPG_RO, the channel initialization time CIT may be determined according to the logical page of the third logical page read operation 3LPG_RO. Since the third channel initialization time 3CIT is mapped to the CSB page according to the channel initialization time table CIT_T, the channel initialization operation may be performed during the third channel initialization time 3CIT in the fourth logical page read operation 4LPG_RO. After the channel initialization operation is completed, in the fourth logical page read operation 4LPG_RO, the read operations using the fifteenth, ninth, fifth, and third read voltages 15Vr, 9Vr, 5Vr, and 3Vr corresponding to the MSB page may be sequentially performed.

The read operations may be performed in various orders other than the embodiments described with reference to FIGS. 15A to 15C.

Figure 16:
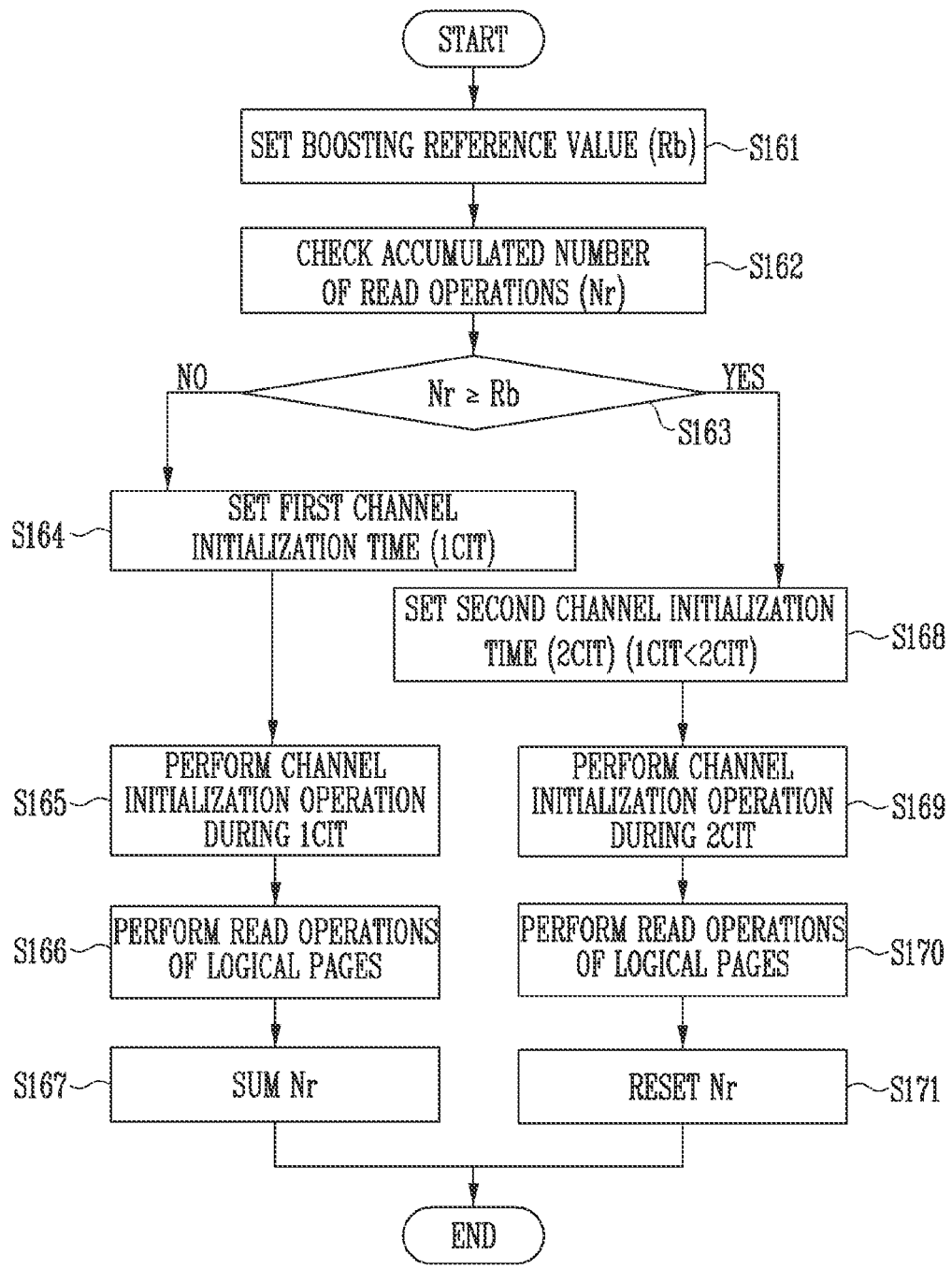
FIG. 16 is a flowchart illustrating a read operation according to a second embodiment of the present disclosure.

FIG. 16 is a flowchart illustrating a read operation according to a second embodiment of the present disclosure.

Referring to FIG. 16, in the second embodiment, the channel initialization time may be adjusted according to an accumulated boosting level of the selected page. Here, the selected page may be the physical page that is connected to the selected word line, and the accumulated boosting level may be determined according to the accumulated number of read operations of the logical pages that has been performed on the selected page. The read operation according to the second embodiment is specifically described as follows.

A boosting reference value Rb of the selected memory block or the selected page is set (S161). The boosting reference value Rb may be a value that is obtained by digitally converting a voltage of a channel in which the hot channel injection may occur. For example, the voltage of the channel in which the hot channel injection may occur may be obtained through a test operation of the memory device. Since the boosting reference value Rb is a fixed value, the boosting reference value Rb may be stored in the control logic 130 of FIG. 1 of the memory device or a register included in the memory device. For example, the boosting reference value Rb may be commonly applied to all memory blocks included in the memory device, or different boosting reference values Rb may be set for each of the memory blocks. Alternatively, different boosting reference values Rb may be set for each of the pages included in the memory block.

When the read command and the address are input to the control logic 130, the control logic may check the accumulated number of read operations Nr of the selected page (S162). The accumulated number of read operations Nr of the selected page may be a value that is obtained by summing the number of read operations of the logical pages performed on the selected page.

The control logic 130 may compare the accumulated number of read operations Nr to the boosting reference value Rb (S163). For example, the control logic 130 may determine whether the accumulated number of read operations Nr is equal to or greater than the boosting reference value Rb.

In step S163, when the accumulated number of read operations Nr is not equal to or greater than the boosting reference value Rb (No), the control logic 130 may set the first channel initialization time 1CIT to the time in which the channel initialization operation is to be performed (S164). Subsequently, the channel initialization operation may be performed during the first channel initialization time 1CIT (S165), and the read operations of the logical pages may be performed (S166). When the read operations of the logical pages are completed, the control logic 130 may sum up the number of read operations that are performed in step S166 to the accumulated number of read operations Nr (S167). The summed accumulated number of read operations Nr may be used as the accumulated number of read operations Nr that is checked in step S162 during a subsequent read operation.

In step S163, when the accumulated number of read operations Nr is equal to or greater than the boosting reference value Rb (Yes), the control logic 130 may set the second channel initialization time 2CIT, which is longer than the first channel initialization time 1CIT, to the time in which the channel initialization operation is to be performed (S168). Subsequently, the channel initialization operation may be performed during the second channel initialization time 2CIT (S169) and the read operations of the logical pages may be performed (S170). When the read operations of the logical page are completed, the control logic 130 may reset the accumulated number of read operations Nr (S171). The reason for resetting the accumulated number of read operations Nr is that the channel layer is initialized during the second channel initialization time 2CIT in step S169, and the boosting level of the channel layer becomes sufficiently low.

That is, in the second embodiment, when the accumulated boosting level of the channel layer is not high enough that the hot carrier injection occurs, the time that is required for the channel initialization operation is shortened in order to shorten a read operation time, and when the accumulated boosting level is high enough that the hot carrier injection occurs, the time that is required for the channel initialization operation increases in order to improve reliability of the read operation.

Figure 17:
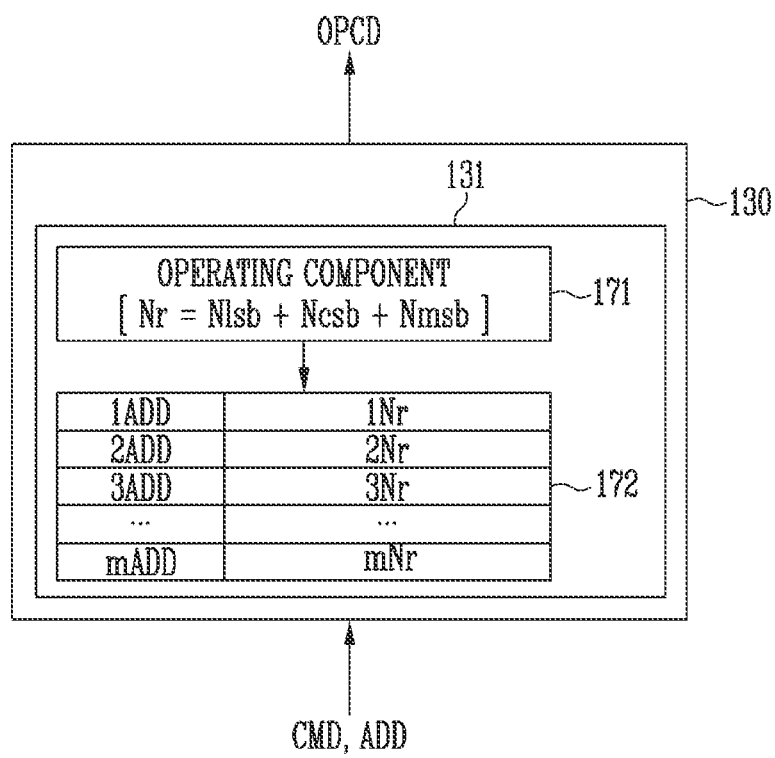
FIG. 17 is a diagram illustrating a control logic configured to perform the read operation according to the second embodiment of the present disclosure.

FIG. 17 is a diagram illustrating the control logic configured to perform the read operation according to the second embodiment of the present disclosure.

Referring to FIG. 17, in order to perform the read operation according to the second embodiment, the control logic 130 may include a monitor unit 131 for checking the number of read operations that are performed on the selected page.

The monitoring unit 131 may include an operating component 171 and a register 172.

The operating component 171 may calculate the accumulated number of read operations Nr by summing up the number of times the read operations, for each of the logical pages, has been performed on the selected page. Using the read operation of the TLC method as an example, the operating component 171 may calculate the accumulated number of read operations Nr by adding the number of read operations of the LSB page Nlsb, the number of read operations of the CSB page Ncsb, and the number of read operations of the MSB page Nmsb. When the accumulated number of read operations Nr is calculated, the operating component 171 may store the calculated accumulated number of read operations Nr in the register 172. For example, the accumulated number of read operations 1Nr to mNr corresponding to respective addresses 1ADD to mADD may be stored and updated in the register 172. The addresses 1ADD to mADD that are stored in the register 172 may be addresses of physical pages.

When the read command CMD and the address ADD are input to the control logic 130, the control logic 130 may check the accumulated number of read operations Nr corresponding to the address of the selected page and may adjust the channel initialization time according to a comparison result of the accumulated number of read operations Nr and the boosting reference value Rb of FIG. 16 to output the operation code OPCD.

Figure 18:
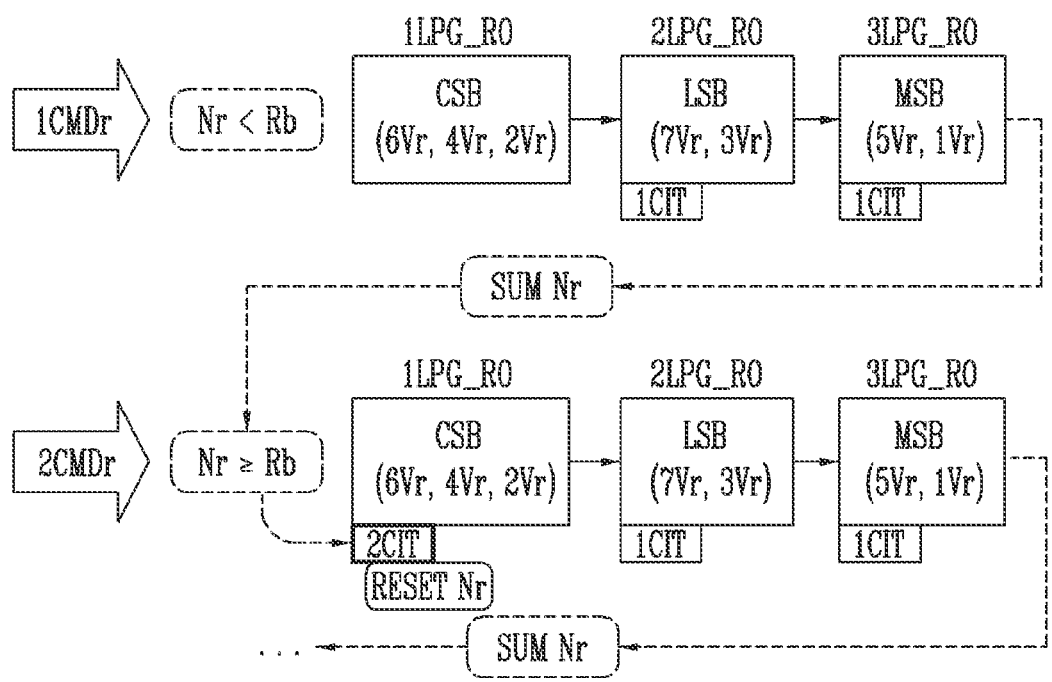
FIG. 18 is a diagram illustrating in detail the read operation according to the second embodiment of the present disclosure.

FIG. 18 is a diagram illustrating in detail the read operation according to the second embodiment of the present disclosure.

Referring to FIGS. 18 and 17, diagrams illustrating the read operations in which the read operation of the TLC method is performed in the order of the CSB, LSB, and MSB pages are shown.

When a first read command 1CMDr is input to the control logic 130, the control logic 130 may compare the accumulated number of read operations Nr of the selected page to the boosting reference value Rb. When the accumulated number of read operations Nr is less than the boosting reference value Rb, since the probability of the occurrence of the hot carrier injection in the selected page is low, the control logic 130 may set the order of operation so that each of the channel initialization operations that are performed in the first to third logical page read operations 1LPG_RO to 3LPG_RO is performed during the first channel initialization time 1CIT. For example, when the first logical page read operation 1LPG_RO Is performed as the read operation of the CSB page, the second logical page read operation 2LPG_RO may be performed as the read operation of the LSB page, and the third logical page read operation 3LPG_RO may be performed as the read operation of the MSB page, the channel Initialization operation that is performed in the second logical page read operation 2LPG_RO may be performed during the first channel initialization time 1CIT regardless of the logical page of the first logical page read operation 1LPG_RO. Also in the third logical page read operation 3LPG_RO, the channel initialization operation may be performed during the first channel initialization time 1CIT regardless of the logical page of the second logical page read operation 2LPG_RO.

When the read operation of the selected page is ended, the control logic 130 may sum up the number of read operations performed on the selected page as the accumulated number of read operations Nr and may store the summed value.

After the read operation of the selected page is ended, when a second read command 2CMDr is input to the control logic 130, the control logic 130 may compare the accumulated number of read operations Nr of the selected page to the boosting reference value Rb. The second read command 2CMDr is the same as the first read command 1CMDr but has an input time that is different from that of the first read command 1CMDr, and the accumulated number of read operations Nr is a value that is obtained by summing the number of read operations performed on the selected page by the first read command 1CMDr. When the accumulated number of read operations Nr is equal to or greater than the boosting reference value Rb, the probability of the occurrence of the hot carrier injection in the selected page is high, the control logic 130 may set the order of operation so that the channel initialization operation is performed during the second channel initialization time 2CIT, which is longer than the first channel initialization time 1CIT, in the first logical page read operation 1LPG_RO and the channel initialization operation is performed during the first channel initialization time 1CIT in the second and third logical page read operations 2LPG_RO and 3LPG_RO. The reason that the channel initialization operation is set to the second channel initialization time 2CIT in the first logical page read operation 1LPG_RO is to lower the channel potential of the strings before the first to third logical page read operations 1LPG_RO to 3LPG_RO are performed. The reason that the channel initialization operation is set to the first channel initialization time 1CIT again in the second and third logical page read operations 2LPG_RO and 3LPG_RO is to shorten an operation time of the remaining second and third logical page read operations 2LPG_RO and 3LPG_RO.

After the channel initialization operation is performed during the second channel initialization time 2CIT in the first logical page read operation 1LPG_RO, the control logic 130 may reset the accumulated number of read operations Nr. Here, the term "reset" means changing the accumulated number of read operations Nr to 0.

The number of read operations that are performed after the first logical page read operation 1LPG_RO may be summed up again after the accumulated number of read operations Nr has been reset to 0.

Figure 19:
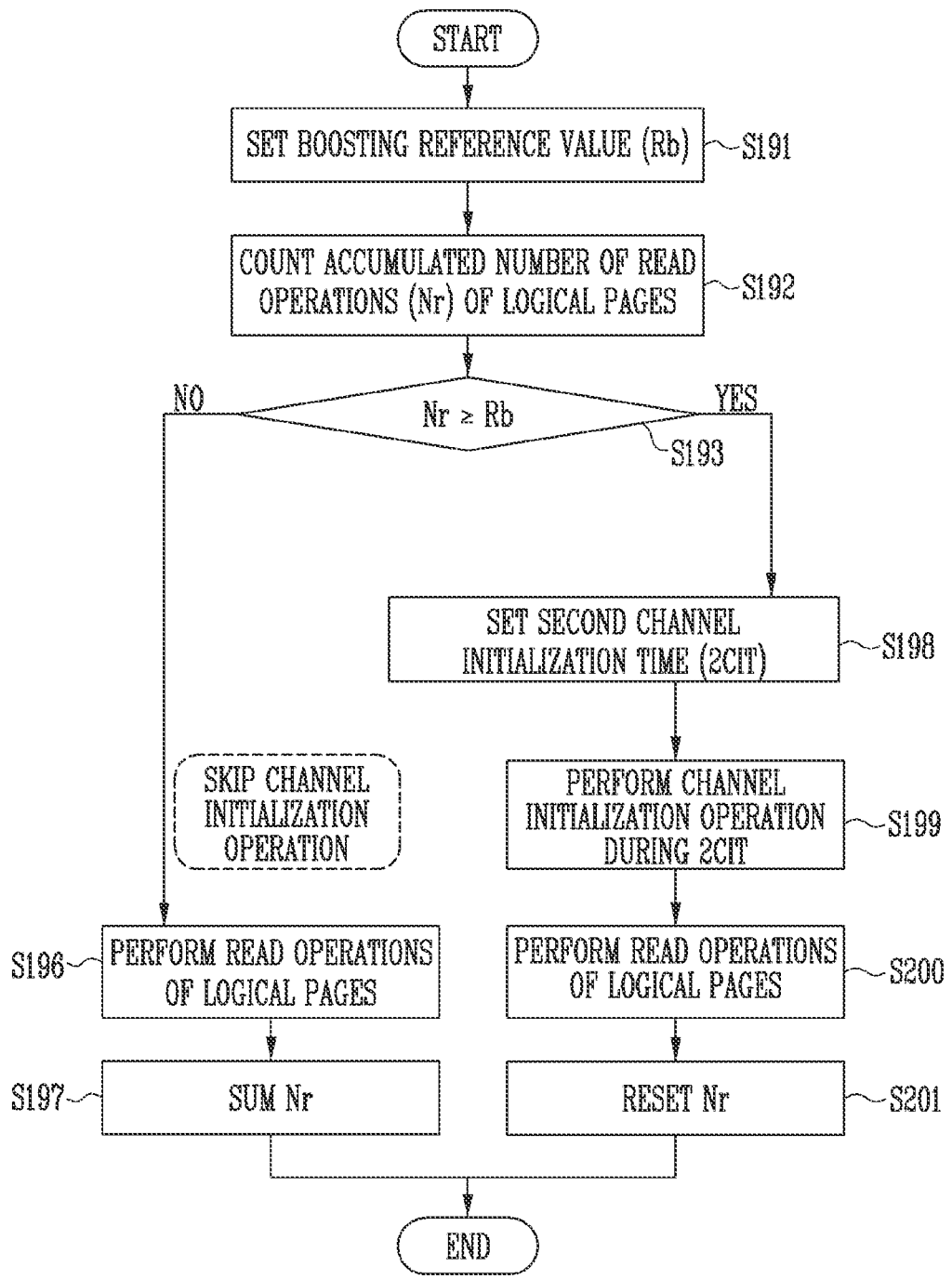
FIG. 19 is a flowchart illustrating a read operation according to a third embodiment of the present disclosure.

FIG. 19 is a flowchart illustrating a read operation according to a third embodiment of the present disclosure.

Referring to FIG. 19, the read operation according to the third embodiment may be performed similarly to the second embodiment, except for a case in which the accumulated number of read operations Nr is not equal to or greater than the boosting reference value Rb (No) in step S163 of the second embodiment. For example, steps S191 to S193 and steps S198 to S201 of the third embodiment may be performed identically to steps S161 to S163 and steps S168 to S171 of the second embodiment. Therefore, a description of steps S191 to S193 and steps S198 to S201 that overlap the second embodiment has been omitted.

In step S193 of the third embodiment, when the accumulated number of read operations Nr is not equal to or greater than the boosting reference value Rb (No), the control logic 130 may omit the channel initialization operation in the read operations of the selected page. That is, when the probability of the occurrence of the hot carrier injection is low, the initialization operation may be omitted in order to shorten the operation time of the read operations performed on the selected page. Therefore, when the accumulated number of read operations Nr is not equal to or greater than the boosting reference value Rb (No) in step S193, the read operation of the logical pages may be performed without the channel initialization operation (S196). Even though the channel initialization operation is omitted, the operation of precharging the bit lines is performed.

When the read operations of the logical pages are completed, the control logic 130 may sum up the number of read operations that are performed in step S196 to the accumulated number of read operations Nr (S197). The summed accumulated number of read operations Nr may be used as the accumulated number of read operations Nr that is checked in step S192 during the next read operation.

That is, in the third embodiment, when the accumulated boosting level of the channel layer is not high enough that the hot carrier injection occurs, the channel initialization operation is omitted to shorten the read operation time. When the accumulated boosting level is high enough that the hot carrier injection occurs, the channel potential may be lowered by performing the channel initialization operation during the second channel initialization time 2CIT, which is longer than the first channel initialization time 1CIT, in order to improve the reliability of the read operation.

Figure 20:
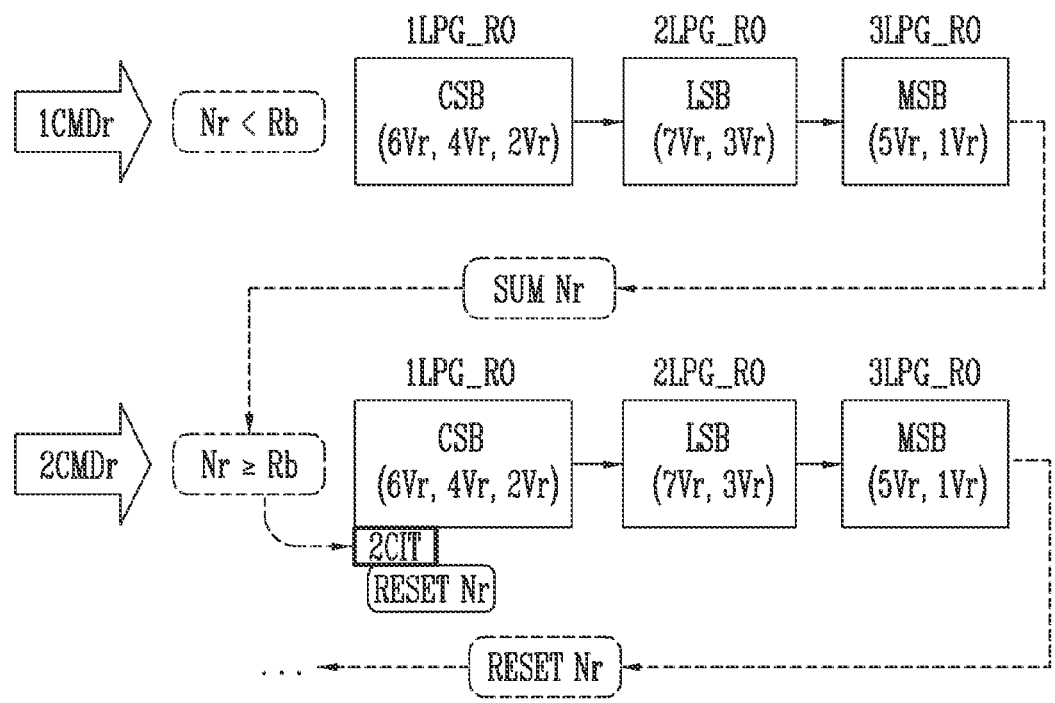
FIG. 20 is a diagram illustrating in detail the read operation according to the third embodiment of the present disclosure.

FIG. 20 is a diagram illustrating in detail the read operation according to the third embodiment of the present disclosure.

Referring to FIGS. 20 and 17, diagrams illustrating the read operations in which the read operation of the TLC method is performed in the order of the CSB, LSB, and MSB pages are shown.

When the first read command 1CMDr is input to the control logic 130, the control logic 130 may compare the accumulated number of read operations Nr of the selected page to the boosting reference value Rb. When the accumulated number of read operations Nr is less than the boosting reference value Rb, since the probability of the occurrence of the hot carrier injection in the selected page is low, the control logic 130 may omit the channel initialization operations in the first to third logical page read operations 1LPG_RO to 3LPG_RO. Even though the channel initialization operations are omitted, the operation of precharging the bit lines in each of the read operations may be performed.

When the read operation of the selected page is ended, the control logic 130 may sum up the number of read operations that are performed on the selected page as the accumulated number of read operations Nr and may store a summed value.

After the read operation of the selected page is ended, when the second read command 2CMDr is input to the control logic 130, the control logic 130 may compare the accumulated number of read operations Nr of the selected page to the boosting reference value Rb. The second read command 2CMDr is the same as the first read command 1CMDr but has an input time that is different from that of the first read command 1CMDr, and the accumulated number of read operations Nr is a value that is obtained by summing up the number of read operations that are performed on the selected page by the first read command 1CMDr. When the accumulated number of read operations Nr is equal to or greater than the boosting reference value Rb, since the probability of the occurrence of the hot carrier injection in the selected page is high, the control logic 130 may set the order of operation so that the channel initialization operation is performed during the second channel initialization time 2CIT in the first logical page read operation 1LPG_RO and may omit the channel initialization operation in the second and third logical page read operations 2LPG_RO and 3LPG_RO. The reason that the channel initialization operation is set to the second channel initialization time 2CIT in the first logical page read operation 1LPG_RO is to lower the channel potential of the strings before the first to third logical page read operations 1LPG_RO to 3LPG_RO are performed. The reason that the channel initialization operation is omitted in the second and third logical page read operations 2LPG_RO and 3LPG_RO is to shorten the operation time of the remaining second and third logical page read operations 2LPG_RO and 3LPG_RO.

After the channel initialization operation is performed during the second channel initialization time 2CIT in the first logical page read operation 1LPG_RO, the control logic 130 may reset the accumulated number of read operations Nr. Here, the term "reset" means changing the accumulated number of read operations Nr to 0.

The number of read operations that are performed after the first logical page read operation 1LPG_RO may be summed up again after the accumulated number of read operations Nr has been reset to 0.

Figure 21:
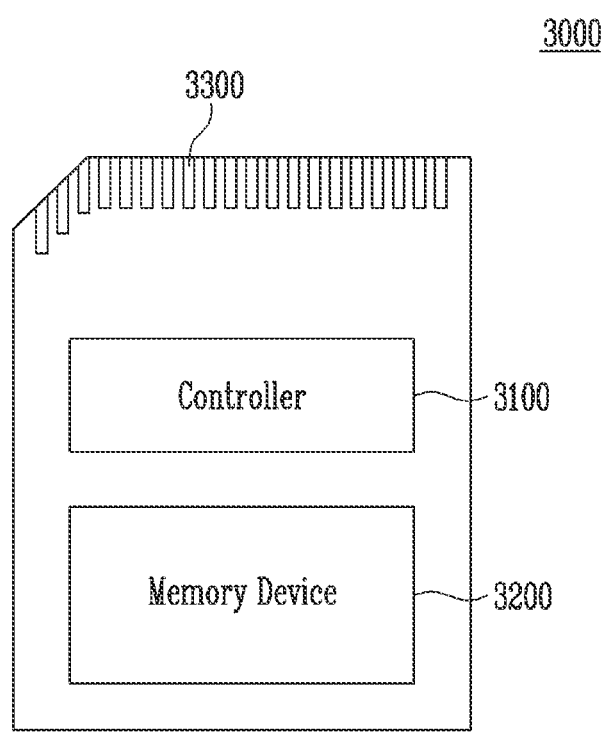
FIG. 21 is a diagram illustrating a memory card system to which a memory device of the present disclosure is applied.

FIG. 21 is a diagram illustrating a memory card system to which a memory device of the present disclosure is applied.

Referring to FIG. 21, the memory card system 3000 includes a controller 3100, a memory device 3200, and a connector 3300.

The controller 3100 may be connected to the memory device 3200. The controller 3100 may be configured to access the memory device 3200. For example, the controller 3100 may be configured to control a program, read, or erase operation of the memory device 3200 or to control a background operation. The controller 3100 may be configured to provide an interface between the memory device 3200 and a host. The controller 3100 may be configured to drive firmware for controlling the memory device 3200. For example, the controller 3100 may include components such as a random access memory (RAM), a processing unit, a host interface, a memory interface, and an error correction circuit.

The controller 3100 may communicate with an external device through the connector 3300. The controller 3100 may communicate with an external device (for example, the host) according to a specific communication standard. For example, the controller 3100 may be configured to communicate with an external device through at least one of various communication standards, such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 3300 may be defined by at least one of the various communication standards described above.

The memory device 3200 may include a plurality of memory cells and may be configured identically to the memory device 100 shown in FIG. 1. Therefore, during the read operation of the selected page, the memory device 3200 may adjust the channel initialization time according to the logical page of the read operation performed in the previous step.

The controller 3100 and the memory device 3200 may be integrated into one semiconductor device to configure a memory card. For example, the controller 3100 and the memory device 3200 may be integrated into one semiconductor device to configure a memory card, such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 22:
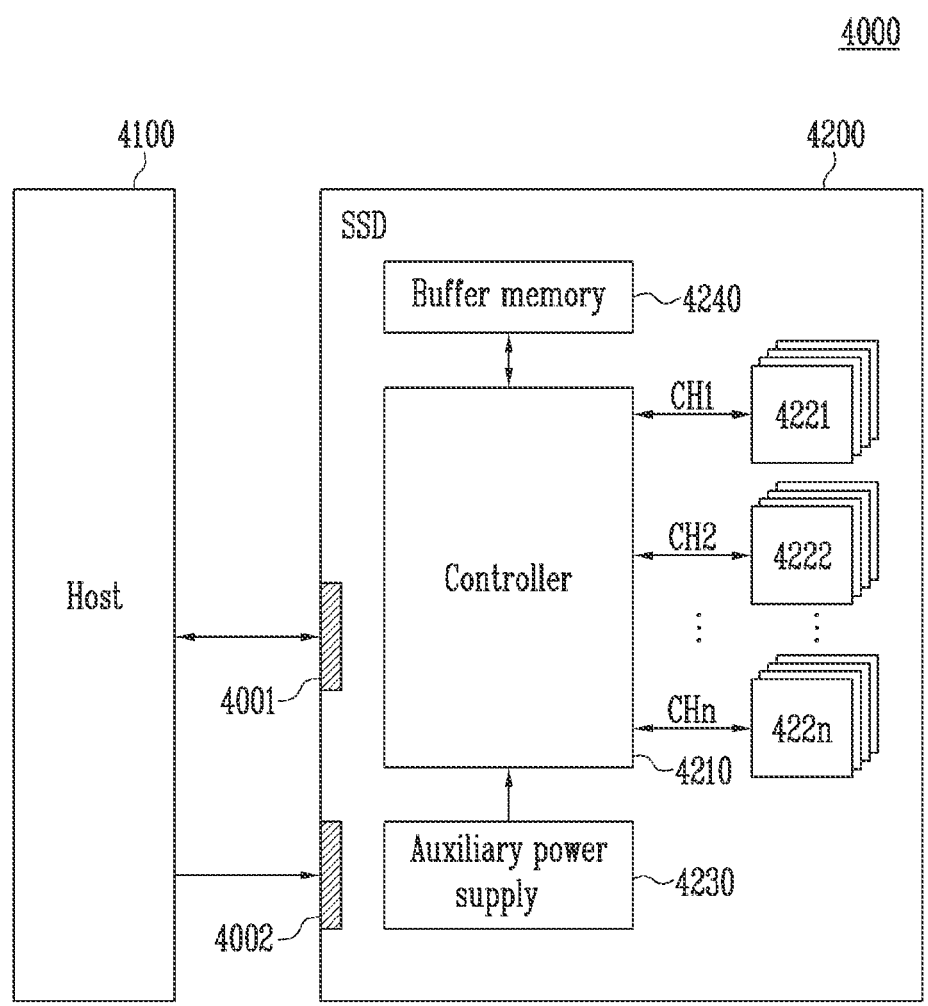
FIG. 22 is a diagram illustrating a solid state drive (SSD) system to which a memory device of the present disclosure is applied.

FIG. 22 is a diagram illustrating a solid state drive (SSD) system to which a memory device of the present disclosure is applied.

Referring to FIG. 22, the SSD system 4000 may include a host 4100 and an SSD 4200. The SSD 4200 may exchange a signal with the host 4100 through a signal connector 4001 and may receive power through a power connector 4002. The SSD 4200 may include a controller 4210, a plurality of memory devices 4221 to 422n, an auxiliary power supply 4230, and a buffer memory 4240.

The controller 4210 may control the plurality of memory devices 4221 to 422n in response to the signal that is received from the host 4100. For example, the signal may be signals based on an interface between the host 4100 and the SSD 4200. For example, the signal may be a signal that is defined by at least one of interfaces, such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The plurality of memory devices 4221 to 422n may include a plurality of memory cells configured to store data. Each of the plurality of memory devices 4221 to 422n may be configured identically to the memory device 100, shown in FIG. 1. Therefore, during the read operation of the selected page, each of the plurality of memory devices 4221 to 422n may adjust the channel initialization time according to the logical page of the read operation that is performed in the previous step. The plurality of memory devices 4221 to 422n may communicate with the controller 4210 through channels CH1 to CHn.

The auxiliary power supply 4230 may be connected to the host 4100 through the power connector 4002. The auxiliary power supply 4230 may receive a power voltage from the host 4100 and charge the power voltage. The auxiliary power supply 4230 may provide a power voltage of the SSD 4200 when power supply from the host 4100 is not smooth. For example, the auxiliary power supply 4230 may be positioned in the SSD 4200 or may be positioned outside of the SSD 4200. For example, the auxiliary power supply 4230 may be positioned on a main board and may provide auxiliary power to the SSD 4200.

The buffer memory 4240 may operate as a buffer memory of the SSD 4200. For example, the buffer memory 4240 may temporarily store data that is received from the host 4100 or data that is received from the plurality of memory devices 4221 to 422n or may temporarily store meta data (for example, a mapping table) of the memory devices 4221 to 422n. The buffer memory 4240 may include a volatile memory, such as a DRAM, an SDRAM, a DDR SDRAM, and an LPDDR SDRAM, or a nonvolatile memory, such as an FRAM, a ReRAM, an STT-MRAM, and a PRAM.

What is claimed is:

1. A memory device comprising:
a memory block including pages configured of a plurality of memory cells;
a peripheral circuit configured to perform a read operation on a selected page, among the pages; and
a control logic configured to control the peripheral circuit to perform a first read operation on a first logical page and then perform a second read operation on a second logical page, among the first and second logical pages in the selected page, during the read operation,
wherein the control logic is configured to:
control the peripheral circuit to adjust a channel initialization time according to the first logical page after the first read operation is ended,
perform a channel initialization operation during the channel initialization time during the second read operation,
adjust the channel initialization time according to a result of comparing a level of the first logical page with a level of the second logical page.

2. The memory device of claim 1, wherein the first and second logical pages are data, in each of the plurality of memory cells, included in the selected page.

3. The memory device of claim 1, wherein, during the first read operation, the control logic is configured to control the peripheral circuit to perform a read step by using at least one read voltage to sense data that are included in the first logical page.

4. The memory device of claim 1, wherein, during the second read operation, the control logic is configured to control the peripheral circuit to perform a read step by using at least one read voltage to sense data that are included in the second logical page.

5. The memory device of claim 1, wherein, when a level of the first logical page is higher than a level of the second logical page, the control logic is configured to set the channel initialization time to a first channel initialization time, and when the level of the first logical page is lower than the level of the second logical page, the control logic is configured to set the channel initialization time to a second channel initialization time that is longer than the first channel initialization time.

6. A memory device comprising:

a memory block including pages configured of a plurality of memory cells;

a peripheral circuit configured to perform a read operation on a selected page, among the pages; and a control logic configured to control the peripheral circuit to perform a first read operation on a first logical page and then perform a second read operation on a second logical page, among the first and second logical pages, during the read operation, wherein the control logic is configured to:

control the peripheral circuit to adjust a channel initialization time according to an accumulated boosting level of the selected page, wherein the accumulated boosting level of the selected page is determined based on an accumulated number of read operations performed on the first and second logical pages in the selected page, perform a channel initialization operation during the channel initialization time during the first read operation, and adjust the channel initialization time according to a result of comparing a preset boosting reference value to the accumulated number of read operations.

7. The memory device of claim 6, wherein the control logic includes a monitoring unit configured to check the number of times the read operation has been performed on the selected page as the accumulated boosting level.

8. The memory device of claim 7, wherein the monitoring unit comprises:

an operating component configured to calculate the accumulated number of read operations by summing the number of times the read operations, for each of the first and second logical pages, has been performed on the selected page; and a register configured to store addresses of each of the pages and the accumulated number of read operations corresponding to each of the addresses.

9. The memory device of claim 8, wherein the operating component updates and stores the accumulated number of read operations in the register when the accumulated number of read operations is changed.

10. The memory device of claim 6, wherein the boosting reference value is set to a value corresponding to a channel potential when hot carrier injection occurs in the plurality of memory cells.

11. The memory device of claim 6, wherein the boosting reference value is calculated through a test operation and is a fixed value that is stored in the control logic.

12. The memory device of claim 6, wherein, when the accumulated number of read operations is lower than the boosting reference value, the channel initialization time is set to a first channel initialization time, and wherein, when the accumulated number of read operations is equal to or greater than the boosting reference value, the channel initialization time is set to a second channel initialization time that is longer than the first channel initialization time.

* * * * *